(12) United States Patent
Umebayashi et al.

(10) Patent No.: US 10,950,647 B2
(45) Date of Patent: *Mar. 16, 2021

(54) SEMICONDUCTOR DEVICE AND METHOD OF MANUFACTURING THE SAME, AND ELECTRONIC APPARATUS

(71) Applicant: Sony Corporation, Tokyo (JP)

(72) Inventors: Taku Umebayashi, Kanagawa (JP); Hiroshi Takahashi, Kanagawa (JP); Reijiroh Shohji, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/913,075

(22) Filed: Jun. 26, 2020

(65) Prior Publication Data

US 2020/0328244 A1 Oct. 15, 2020

Related U.S. Application Data

(63) Continuation of application No. 16/358,348, filed on Mar. 19, 2019, now Pat. No. 10,916,577, which is a
(Continued)

(30) Foreign Application Priority Data

Mar. 19, 2009 (JP) .............................. JP2009-068582
Jan. 22, 2010 (JP) .............................. JP2010-012586

(51) Int. Cl.
*H01L 27/146* (2006.01)
*H01L 31/14* (2006.01)
(Continued)

(52) U.S. Cl.
CPC .. *H01L 27/14634* (2013.01); *H01L 21/76898* (2013.01); *H01L 23/481* (2013.01); *H01L 27/1464* (2013.01); *H01L 27/1469* (2013.01); *H01L 27/14612* (2013.01); *H01L 27/14621* (2013.01); *H01L 27/14627* (2013.01); *H01L 27/14632* (2013.01); *H01L 27/14636* (2013.01); *H01L 27/14643* (2013.01); *H01L 27/14645* (2013.01); *H01L 27/14687* (2013.01); *H04N 5/225* (2013.01); *H04N 5/374* (2013.01); *H04N 5/379* (2018.08); *H01L 2224/11* (2013.01)

(58) Field of Classification Search
CPC ........... H01L 27/14634; H01L 27/1464; H01L 27/1469
See application file for complete search history.

(56) References Cited

U.S. PATENT DOCUMENTS 10,141,361 B2 * 11/2018 Umebayashi ....... H01L 27/1464
2008/0093708 A1 4/2008 Noma et al.

* cited by examiner

*Primary Examiner* — Dale E Page
*Assistant Examiner* — Wilner Jean Baptiste
(74) *Attorney, Agent, or Firm* — Sheridan Ross P.C.

(57) ABSTRACT

A semiconductor device is provided as a back-illuminated solid-state imaging device. The device is manufactured by bonding a first semiconductor wafer with a pixel array in a half-finished product state and a second semiconductor wafer with a logic circuit in a half-finished product state together, making the first semiconductor wafer into a thin film, electrically connecting the pixel array and the logic circuit, making the pixel array and the logic circuit into a finished product state, and dividing the first semiconductor wafer and the second semiconductor being bonded together into microchips.

28 Claims, 29 Drawing Sheets

Related U.S. Application Data continuation of application No. 15/814,177, filed on Nov. 15, 2017, now Pat. No. 10,403,670, which is a continuation of application No. 15/713,226, filed on Sep. 22, 2017, now Pat. No. 10,141,361, which is a continuation of application No. 15/374,864, filed on Dec. 9, 2016, now Pat. No. 9,799,695, which is a continuation of application No. 15/087,695, filed on Mar. 31, 2016, now Pat. No. 9,530,812, which is a continuation of application No. 14/834,010, filed on Aug. 24, 2015, now Pat. No. 9,319,569, which is a continuation of application No. 12/722,069, filed on Mar. 11, 2010, now Pat. No. 9,451,131.

(51) Int. Cl.
  *H01L 21/768* (2006.01)
  *H01L 23/48* (2006.01)
  *H04N 5/369* (2011.01)
  *H04N 5/225* (2006.01)
  *H04N 5/374* (2011.01)

FIG. 6

SEMICONDUCTOR DEVICE AND METHOD OF MANUFACTURING THE SAME, AND ELECTRONIC APPARATUS

CROSS-REFERENCE TO RELATED APPLICATIONS

This application is a continuation of U.S. patent application Ser. No. 16/358,348 filed Mar. 19, 2019, which is a continuation of U.S. patent application Ser. No. 15/814,177, filed Nov. 15, 2017, now U.S. Pat. No. 10,403,670, which is a continuation of U.S. patent application Ser. No. 15/713,226, filed Sep. 22, 2017, now U.S. Pat. No. 10,141,361, which is a continuation of U.S. patent application Ser. No. 15/374,864, filed Dec. 9, 2016, now U.S. Pat. No. 9,799,695, which is a continuation of U.S. patent application Ser. No. 15/087,695, filed Mar. 31, 2016, now U.S. Pat. No. 9,530,812, which is a continuation of U.S. patent application Ser. No. 14/834,010, filed Aug. 24, 2015, now U.S. Pat. No. 9,319,569, which is a continuation of U.S. patent application Ser. No. 12/722,069, filed Mar. 11, 2010, now U.S. Pat. No. 9,451,131, which claims priority to Japanese Patent Application Nos. JP 2009-068582 and JP 2010-012586, filed in the Japan Patent Office on Mar. 19, 2009 and Jan. 22, 2010, respectively, the entire disclosures of which are hereby incorporated herein by reference.

BACKGROUND OF THE INVENTION

1. Field of the Invention

The present invention relates to a semiconductor device, such as a solid-state imaging device, and a method of manufacturing such a semiconductor device. The present invention also relates to an electronic apparatus, such as a camera, equipped with the semiconductor device.

2. Description of the Related Art

Solid-state imaging devices, which have been commonly used, include amplification-type solid-state imaging devices as typified by MOS image sensors such as complementary metal oxide semiconductors (CMOSs) and charge-transfer solid-state imaging devices as typified by charge coupled device (CCD) image sensors. These solid-state imaging devices have been widely used for digital still cameras, digital video cameras, and so on. Furthermore, in recent years, MOS image sensors have been used for most of solid-state imaging devices mounted on mobile devices such as camera cell-phones and PDAs (Personal Digital Assistants) because of their low power voltages, low consumption powers, and so on.

The MOS solid-state imaging device includes a pixel array (pixel region) where a plurality of unit pixels are arranged in a two-dimensional array, and a peripheral circuit region. The unit pixel is formed of a photodiode and a plurality of pixel transistors, serving as a photoelectric conversion part. The pixel transistors may be three MOS transistors: a transfer transistor, a reset transistor, and an amplification transistor, or may be four in which a selection transistor is further included.

Some of the MOS solid-state imaging devices are those in which a semiconductor chip with a pixel region on which a plurality of pixel is arranged is electrically connected to a semiconductor chip in which a logic circuit for signal processing is formed to form a single device. Various kinds of such a device have been proposed. For example, Japanese Unexamined Patent Application Publication No. 2006-49361 discloses a semiconductor module where a back-illuminated image sensor chip having a micro-pad for each pixel cell and a signal processing chip, on which a signal processing circuit is formed, having a micro-pad are connected to each other via a micro-bump. Japanese Unexamined Patent Application Publication No. 2007-13089 discloses a device on which a sensor chip and a signal processing chip are mounted on an interposer (intermediate substrate). The sensor chip is a back-illuminated MOS solid-state imaging device with an imaging pixel section and the signal processing chip is provided with a peripheral circuit performing signal processing. In Japanese Unexamined Patent Application Publication No. 2008-130603, an imaging device includes an image sensor chip, a thin-layer circuit board, and a logic circuit chip for signal processing. In addition, it also discloses the configuration of the device in which the thin-layer circuit board and the logic circuit chip are electrically connected to each other. In this case, the thin-layer circuit board is electrically connected from the backside of the image sensor chip through a through-hole-via.

In addition, Japanese Patent No. 4000507 discloses a solid-state imaging device provided with a penetration electrode on a solid-state imaging element supported on a transparent substrate, where the solid-state imaging element is electrically connected to a flexible circuit substrate. Furthermore, Japanese Unexamined Patent Application Publication No. 2003-31785 discloses a back-illuminated solid-state imaging device provided with an electrode passing through a supporting substrate.

As described in Japanese Unexamined Patent Application Publication Nos. 2006-49361, 2007-13089, and 2008-130603, various technologies for combining an image sensor chip with different circuit chips such as logic circuit have been proposed. In these technologies, any of functional chips is almost completely built up in advance and then mounted on a substrate while being allowed to make a connection between the chips by the formation of a connection through hole.

SUMMARY OF THE INVENTION

As is evident from any of the above solid-state imaging devices, there is an idea of constructing a semiconductor device by making a connection between different microchips using a connection conductor passing through a substrate. However, a connection hole has to be formed deeply in a substrate while being insulated. Thus, it is practically difficult from the viewpoints of the processing of a connection hole and the cost effectiveness of a process for embedding a connection conductor.

On the other hand, the formation of a contact hole with a small diameter of about 1 micrometer uses the thinning of an upper chip to the minimum. In this case, however, some complicated steps, such as one for bonding the upper chip on a supporting substrate, may be desired, which causes an increase in cost. In order to embed the connection conductor in the connection hole with a high aspect ratio, the connection conductor materials are limited because it is necessary to use a CVD film with good coatability, such as tungsten (W), as a connection conductor.

In order to have economical efficiency simply applicable by mass production, it is desirable to choose such art that the aspect ratio of this connecting hole is lowered dramatically so as to form the hole easily and the hole is processed within a related-art wafer manufacturing process without using special connecting hole processing.

Furthermore, it is desirable to provide the solid-state imaging device with a high performance by designing both an imaging region and a logic circuit for signal processing to sufficiently exert their respective performances.

In addition to the solid-state imaging device, it is also desirable to provide any of other semiconductor devices having semiconductor integrated circuits with high performance by designing the circuits to sufficiently exert their respective performances.

The present invention has been made in consideration of the aforementioned desires and intends to provide a solid-state imaging device that allows its circuits to sufficiently exert their respective capabilities to attain mass productivity and cost reduction.

Also, the present invention intends to provide an electronic apparatus, such as a camera, equipped with the above solid-state imaging device.

According to an embodiment of the present invention, a semiconductor device is a back-illuminated solid-state imaging device that includes microchips prepared by bonding a first semiconductor wafer having a pixel array in a half-finished product state (hereinafter, also referred to as a half-finished pixel array) and a second semiconductor wafer having a logic circuit in a half-finished product state (hereinafter, also referred to as a half-finished logic circuit) together and then completing the circuits to make them into microchips. The bonding may include bonding the semiconductor wafers together, thinning the first semiconductor wafer, and making an electric connection between the pixel array and the logic circuit.

In the semiconductor device according to the embodiment of the present invention, a pixel array is formed on a microchip part made of a first semiconductor wafer and a logic circuit is formed on a microchip part of a second semiconductor wafer. Thus, the pixel array and the logic circuit are formed under optimal conditions. Under the optimal process technology, the pixel array and the logic circuit that exert sufficient performance capabilities can be formed.

The second semiconductor wafer with the half-finished logic circuit can also serve as a substrate supporting the first semiconductor wafer to be thinned. Subsequently, the first semiconductor wafer with the half-finished pixel array and the second semiconductor wafer with the half-finished logic circuit are bonded together. Finally, the pixel array in a finished product state and the logic circuit in a finished product state are formed. Therefore, the back-illuminated solid-state imaging device suitable for mass production and cost reduction can be obtained.

A method of manufacturing a semiconductor device according to an embodiment of the present invention prepares a first semiconductor wafer with a half-finished pixel array and a second semiconductor wafer with a half-finished logic circuit. The method includes steps of bonding the first semiconductor wafer and the second semiconductor wafer together, thinning the first semiconductor wafer, and electrically connecting the pixel array and the logic circuit together. The method further includes steps of completing the first semiconductor wafer and the second semiconductor wafer which are bonded together and cutting them into pieces for the respective microchips. Consequently, the back-illuminated solid-state imaging device can be produced.

In the method of manufacturing the semiconductor device according to the embodiment of the present invention, the pixel array is formed on the microchip part of the first semiconductor wafer and the logic circuit is formed on the microchip part of the second semiconductor wafer. Both the pixel array and the logic circuit can be formed under optimum conditions. In other words, under the optimal process technology, the pixel array and the logic circuit that exert sufficient performance capabilities can be formed. In addition, the second semiconductor wafer with the half-finished logic circuit can also serve as a substrate supporting the first semiconductor wafer to be thinned. Subsequently, the first semiconductor wafer with the half-finished pixel array and the second semiconductor wafer with the half-finished logic circuit are bonded together, and then subjected to the thinning and the electric connection, followed by completing the wafers and dividing them into the respective microchips. Consequently, it becomes possible to mass-produce the back-illuminated solid-state imaging device. Thus, the sold-state imaging device can be produced at low cost.

An electronic apparatus according to an embodiment of the present invention includes a solid-state imaging device, an optical system that introduces incident light into a photodiode in the solid-state imaging device, and a signal-processing circuit that processes an output signal from the solid-state imaging device. In the electronic apparatus, the solid-state imaging device is a back-illuminated solid-state imaging device that includes microchips prepared by bonding a first semiconductor wafer having a half-finished pixel array and a second semiconductor wafer having a half-finished logic circuit together and then completing the circuits to make them into microchips. The bonding may include bonding the semiconductor wafers together, thinning the first semiconductor wafer, and making an electric connection between the pixel array and the logic circuit. As the electronic apparatus of the present invention includes the solid-state imaging device of the embodiment of the present invention, the pixel array and the logic circuit that exert sufficient performance capabilities for the solid-state imaging device can be formed. In addition, the solid-state imaging device can be produced at low cost. Thus, the electronic apparatus can be produced at low cost.

According to an embodiment of the present invention, a semiconductor device includes microchips prepared by bonding a first semiconductor wafer having a half-finished first semiconductor integrated circuit and a second semiconductor wafer having a half-finished second semiconductor integrated circuit together and then completing the circuits to make them into microchips. The bonding may include bonding the semiconductor wafers together, thinning the first semiconductor wafer, and making an electric connection between the first semiconductor integrated circuit and the second semiconductor integrated circuit.

In the semiconductor device according to the embodiment of the present invention, a first semiconductor integrated circuit is formed on a microchip part made of a first semiconductor wafer and a second semiconductor integrated circuit is formed on a microchip part of a second semiconductor wafer. Thus, the first semiconductor integrated circuit and the second semiconductor integrated circuit are formed under optimal conditions. Under the optimal process technology, the first semiconductor integrated circuit and the second semiconductor integrated circuit that exert sufficient performance capabilities can be formed.

The second semiconductor wafer with the second semiconductor integrated circuit can also serve as a substrate supporting the first semiconductor wafer to be thinned. Subsequently, the first semiconductor wafer with the half-finished first semiconductor integrated circuit and the second semiconductor wafer with the half-finished second semiconductor integrated circuit are bonded together to finally complete the semiconductor integrated circuits. Therefore, the semiconductor device suitable for mass production and cost reduction can be obtained.

A method of manufacturing a semiconductor device according to an embodiment of the present invention prepares a first semiconductor wafer with a half-finished first semiconductor integrated circuit and a second semiconductor wafer with a half-finished second semiconductor integrated circuit. The method includes steps of bonding the first semiconductor wafer and the second semiconductor wafer together, thinning the first semiconductor wafer, and electrically connecting the first semiconductor integrated circuit and the second semiconductor integrated circuit together. The method further includes steps of completing the first semiconductor wafer and the second semiconductor wafer which are bonded together and cutting them into pieces for the respective microchips.

In the method of producing the semiconductor device according to the embodiment of the present invention, a first semiconductor integrated circuit is formed on a microchip part made of a first semiconductor wafer and a second semiconductor integrated circuit is formed on a microchip part of a second semiconductor wafer. Thus, the first semiconductor integrated circuit and the second semiconductor integrated circuit are formed under optimal conditions. Under the optimal process technology, the first semiconductor integrated circuit and the second semiconductor integrated circuit that exert sufficient performance capabilities can be formed.

In addition, the second semiconductor wafer with the half-finished second semiconductor integrated circuit can also serve as a substrate supporting the first semiconductor to be thinned. Subsequently, the first semiconductor wafer with the half-finished first semiconductor integrated circuit and the second semiconductor wafer with the half-finished second semiconductor integrated circuit are bonded together, and then subjected to the thinning and the electric connection, followed by completing the wafers and dividing them into the respective microchips. Consequently, it becomes possible to mass-produce the semiconductor device. Thus, the semiconductor device can be produced at low cost.

In the semiconductor device according to any of the embodiments of the present invention, the pixel array and the logic circuit that exert their respective sufficient performance capabilities are formed in each microchip part. Thus, a high-performance semiconductor device, or a back-illuminated solid-state imaging device, can be provided. In addition, the high-performance back-illuminated solid-state imaging device with excellent mass productivity and cost effectiveness can be provided.

In the semiconductor device according to any of the embodiments of the present invention, furthermore, the first semiconductor integrated circuit and the second semiconductor integrated circuit that exert their respective sufficient performance capabilities are formed in each microchip part. Therefore, a high-performance semiconductor device can be provided. In addition, the high-performance semiconductor device with excellent mass productivity and cost effectiveness can be provided.

In the method of manufacturing the semiconductor device according to any of the embodiments of the present invention, under the optimal process technology, a high-performance semiconductor device, or a high-performance back-illuminated solid-state imaging device, provided with the pixel array and the logic circuit that exert sufficient performance capabilities can be manufactured. In addition, the high-performance back-illuminated solid-state imaging device with excellent mass productivity and cost effectiveness can be provided.

In the method of manufacturing the semiconductor device according to any of the embodiments of the present invention, under the optimal process technology, a high-performance semiconductor provided with the first semiconductor integrated circuit and the second semiconductor integrated circuit that exert sufficient performance capabilities can be manufactured. In addition, the high-performance semiconductor device with excellent mass productivity and cost effectiveness can be produced.

The electronic apparatus according to the embodiment of the present invention includes a high-performance solid-state imaging device with a lower production cost. Therefore, an inexpensive and reliable electronic apparatus can be provided.

BRIEF DESCRIPTION OF THE DRAWINGS

FIG. 6 is a diagram (third) illustrating the example of the method of manufacturing the solid-state imaging device according to the first embodiment of the present invention;

DESCRIPTION OF THE PREFERRED EMBODIMENTS

Hereinafter, the best mode for carrying out the present invention will be described as embodiments thereof. The embodiments will be described in the following order:

1. Example of the schematic configuration of MOS solid-state imaging device;
2. First embodiment (an example of the configuration of a solid-state imaging device and the method of manufacturing the solid-state imaging device);
3. Second embodiment (an example of the configuration of a solid-state imaging device);
4. Third embodiment (an example of the configuration of a solid-state imaging device);
5. Fourth embodiment (an example of the configuration of a solid-state imaging apparatus and the method of manufacturing the solid-state imaging device);
6. Fifth embodiment (an example of the configuration of a semiconductor device and the method of manufacturing the solid-state imaging device); and
7. Sixth embodiment (an example of an electronic apparatus).

1. Example of the Schematic Configuration of MOS Solid-State Imaging Device

Figure 1:
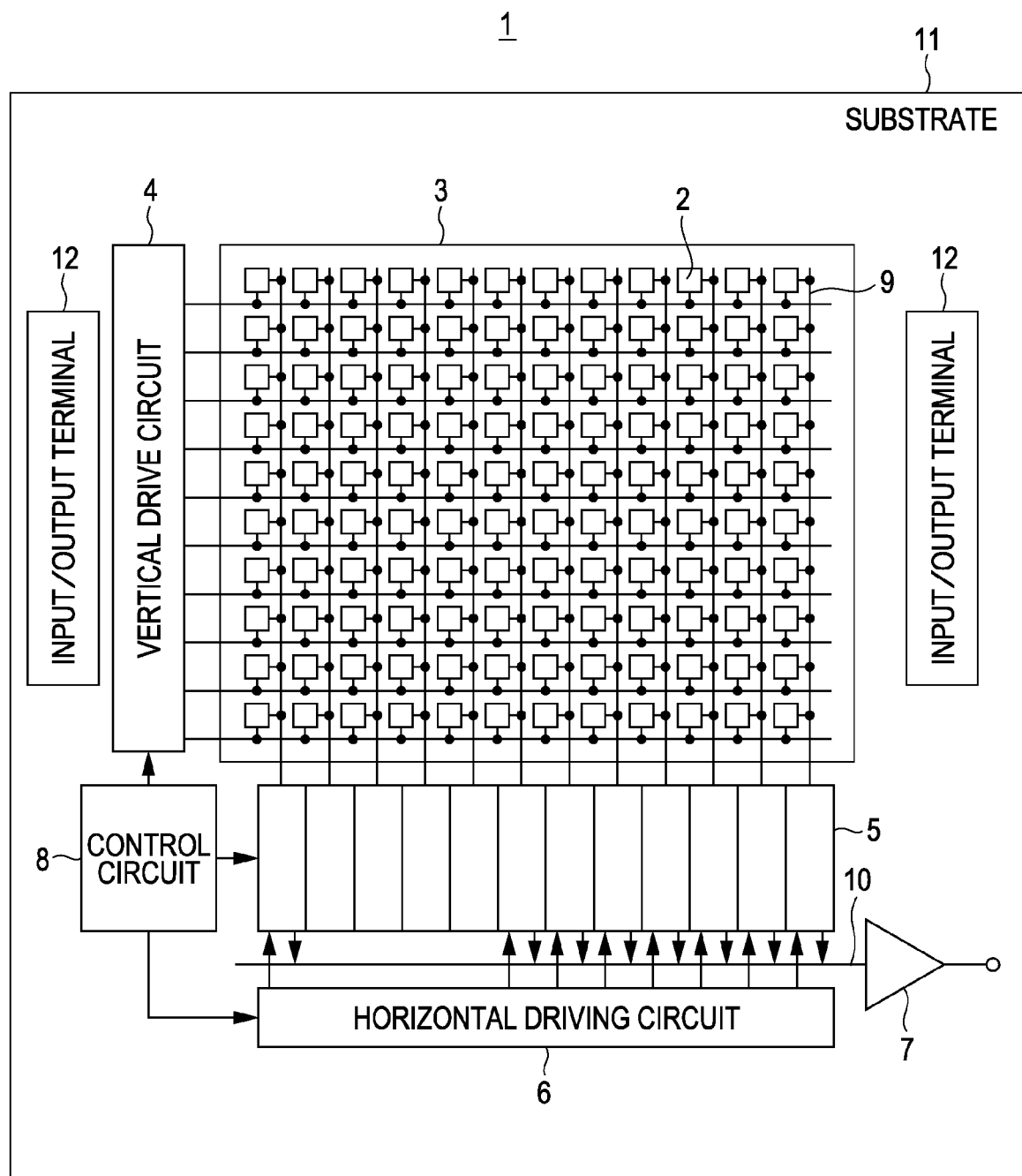
FIG. 1 is a schematic diagram illustrating the configuration of a MOS solid-state imaging device according to an embodiment of the present invention.

FIG. 1 is a schematic diagram illustrating an exemplary configuration of a MOS solid-state imaging device, which can be applied to a semiconductor device of any embodiment of the present invention. The configuration of the MOS solid-state imaging device illustrated in FIG. 1 is also applied to a solid-state imaging device according to each embodiment of the present invention. As shown in FIG. 1, the solid-state imaging device 1 includes a semiconductor substrate 11; a pixel section (so-called pixel array) 3, where a plurality of pixels 2 with photoelectric conversion parts are regularly placed on the silicon substrate 11, and a peripheral circuit section. Each pixel (i.e., unit pixel) 2 includes a photoelectric conversion part such as a photodiode and a plurality of pixel transistors (so-called MOS transistors). The plurality of pixel transistors may include, for example, three transistors: a transfer transistor, a reset transistor, and an amplification transistor. Alternatively, the plurality of pixel transistors may further include a selection transistor, thus including four transistors. The equivalent circuits of the unit pixel is the same as one typically used, so that the details thereof will be omitted in the following description. The pixel 2 may be one unit pixel.

Alternatively, the pixel 2 may have a shared pixel structure. The shared pixel structure includes a plurality of photodiodes, a plurality of transfer transistors, one shared floating diffusion, and each of shared other pixel transistors. In other words, the shared pixel structure includes photodiodes and transfer transistors, which constitute the plurality of unit pixels, and each of other shred pixel transistors.

The peripheral circuit section includes a vertical drive circuit 4, a column signal processing circuit 5, a horizontal drive circuit 6, an output circuit 7, a control circuit 8, and so on.

The control circuit 8 receives an input clock and data for the instruction of an operation mode and so on and outputs information such as the internal information of the solid-state imaging device. In other words, the control circuit 8 generates signals, such as a clock signal and a control signal to be referenced for driving the vertical drive circuit 4, the column signal processing circuit 5, the horizontal drive circuit 6, and so on. Then, the control unit 8 inputs these signals to the vertical drive circuit 4, the column signal processing circuit 5, the horizontal drive circuit 6, and so on.

The vertical drive circuit 4 includes a shift register or the like and drives pixels on a line by selecting a pixel-driving line and supplying a pulse for driving pixels to a selected pixel line-at-a-time. In other words, the vertical drive circuit 4 sequentially performs selective scanning of pixels 2 of the pixel region 3 line-at-a-time in the vertical direction. Then, the vertical drive circuit 4 supplies a pixel signal to the column signal processing circuit 5. Here, the pixel signal is based on a signal electric charge generated according to the amount of light received on the photoelectric transducer (e.g., photodiode) of each pixel 2 through a vertical signal line 9.

In this embodiment, for example, the column signal processing circuit 5 may be provided for each column of the pixels 2 and carries out signal processing, such as noise removal, of a signal output from each of the pixels 2 on one line. In other words, the column signal processing circuit 5 performs CDS (correlated double sampling) for removal of a fixed pattern noise specific to the pixel 2 and signal processing such as signal amplification and AD (analogue-to-digital) conversion. The output stage of the column signal processing circuit 5 is connected to a horizontal selection switch (not shown) which is located between the output stage and a horizontal signal line 10.

The horizontal drive circuit 6, which is constructed of a shift resister or the like, sequentially outputs horizontal scanning pulses, selecting the respective column signal processing circuits 5 in order to output pixel signals thereof to the horizontal signal line 10.

The output circuit 7 carries out signal processing of signals sequentially supplied from the respective column signal processing circuits 5 through the horizontal signal line 10 and then outputs the processed signals. Specifically, for example, the output circuit 7 may only perform buffering or may perform black level adjustment, column variation compensation, various digital signal processing, and so on. An input/output terminal 12 carries out an exchange of signals between the device and the outside.

Figure 2A:
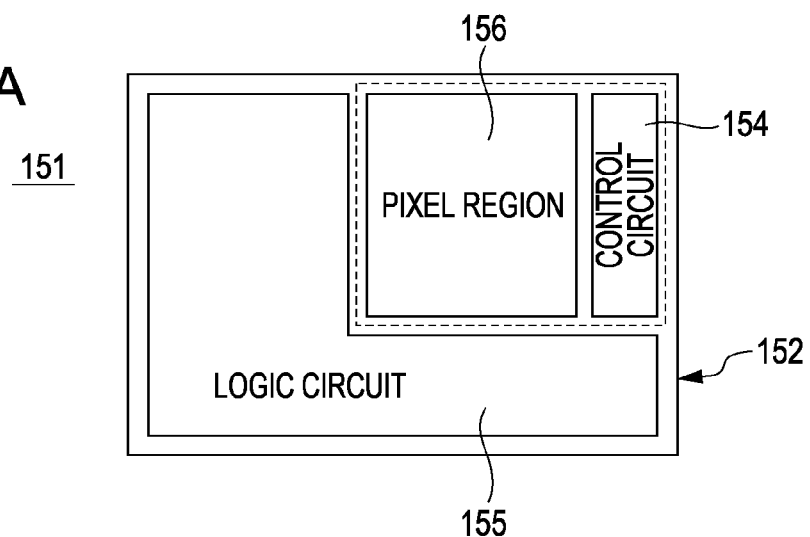
FIGS. 2A to 2C are schematic diagrams illustrating the solid-state imaging device according to the embodiment of the present invention.
Figure 2B:
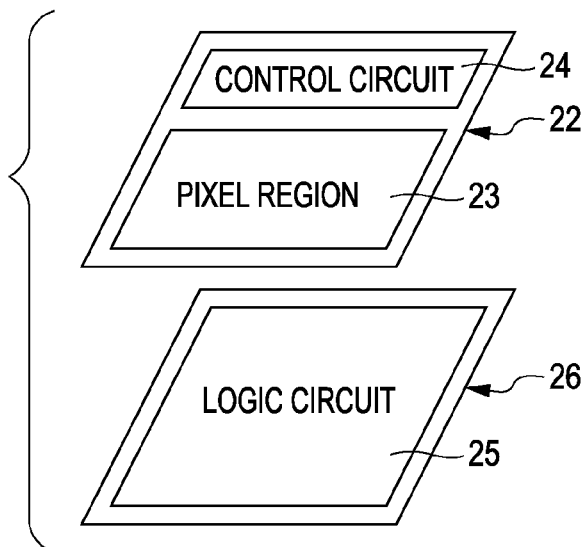
Figure 2C:
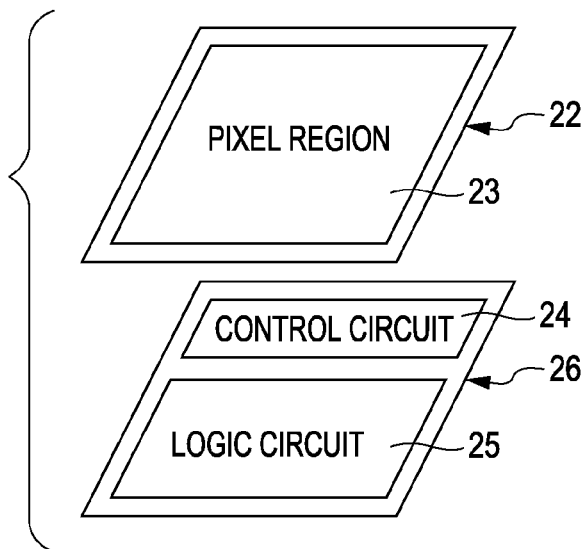

FIGS. 2A to 2C are schematic diagrams illustrating a fundamental configuration of a MOS solid-state imaging device according to an embodiment of the present invention. First, a typical MOS solid-state imaging device 151 will be described with reference to FIG. 2A. The typical MOS solid-state imaging device 151 includes a pixel region 153, a control circuit 154, and a logic circuit 155 for signal processing, which are mounted on a single semiconductor chip 152. In general, an image sensor 156 includes the pixel region 153 and the control circuit 154. As shown in FIG. 2B, on the other hand, a MOS solid-state imaging device 21 according to the embodiment of the present invention includes a pixel region 23 and a control circuit (control region) 124 mounted on a first semiconductor chip section 22 and a logic circuit 25 including a signal processing circuit for signal processing mounted on a second semiconductor chip section 26. The first semiconductor chip section 22 and the second semiconductor chip section 26 are electrically connected to each other to form a single semiconductor chip to provide the MOS solid-state imaging device 21. As shown in FIG. 2C, in a MOS solid-state imaging device 27 according to another embodiment of the present invention, a pixel region 23 is mounted on a first semiconductor chip section 22. Also, a control circuit 24 and a logic circuit 25 including signal processing circuit are mounted on a second semiconductor chip section 26. The first semiconductor chip section 22 and the second semiconductor chip section 26 are electrically connected to each other to form a single semiconductor chip to provide the MOS solid-state imaging device 27.

The features of the MOS solid-state imaging devices according to the above embodiments are found in their manufacturing methods and their configurations based on such methods as described later.

2. First Embodiment

[Example of Configuration of Solid-State Imaging Device and Example of Method of Manufacturing the Solid-State Imaging Device]

Referring now to FIG. 3 and FIGS. 4 to 13, a semiconductor device (i.e., a MOS solid-state imaging device) and a method of manufacturing the solid-state imaging device will be described.

Figure 4:
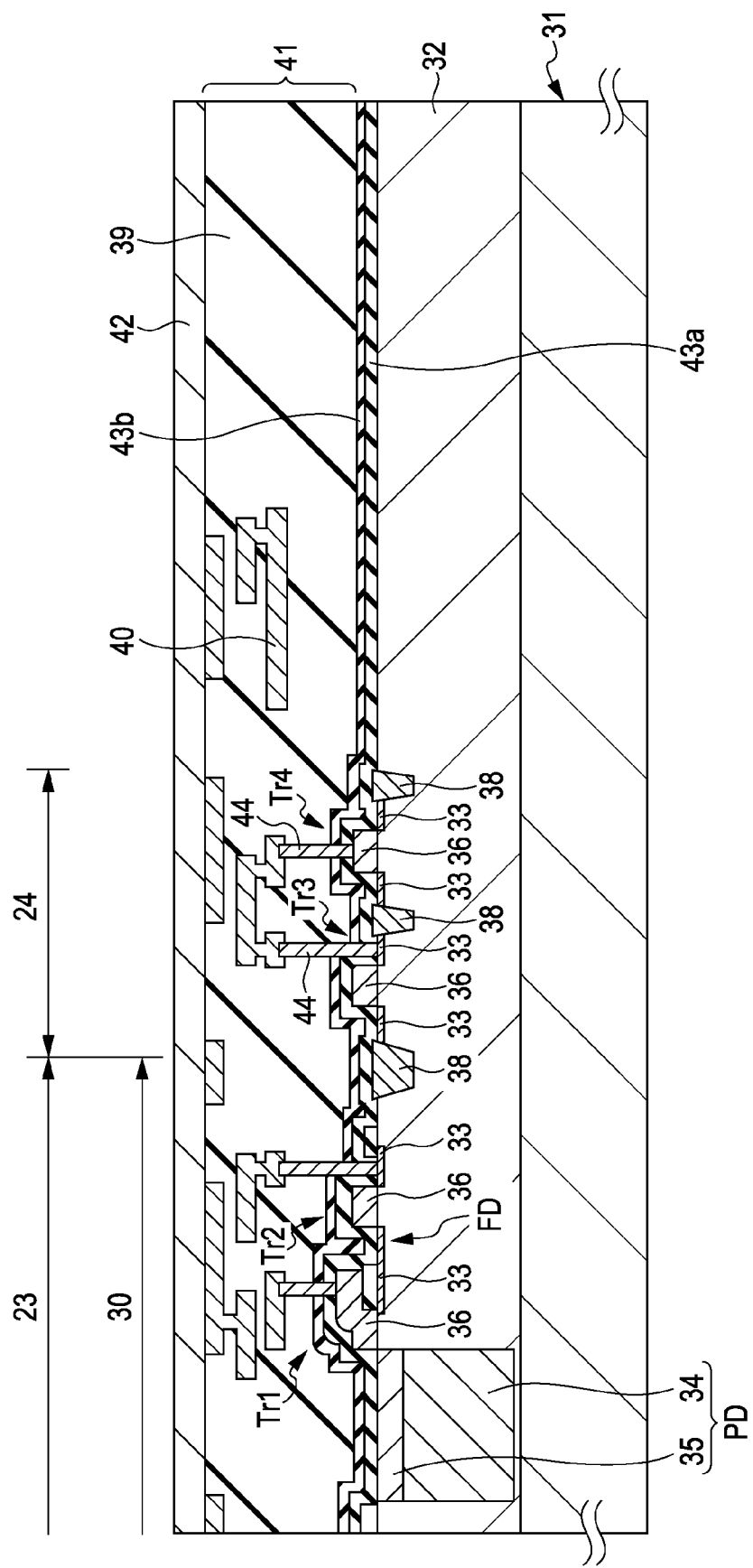
FIG. 4 is a diagram (first) illustrating an example of a method of manufacturing the solid-state imaging device according to the first embodiment of the present invention.

In the first embodiment, first, as shown in FIG. 4, a half-finished image sensor, or an pixel array (hereinafter, also referred to as a pixel region) 23, and a control circuit (control region) 24 are formed on a region to be provided as each microchip part of a first semiconductor wafer (hereinafter, also referred to as a semiconductor substrate) 31. In other words, a photodiode (PD), which acts as a photoelectric conversion part of each pixel, is formed on a region to be formed as each microchip part of the semiconductor substrate (for example, a silicon substrate) 31. Then, a source/drain region 33 of each pixel transistor is formed on a semiconductor well region 32 in the semiconductor substrate 31. The semiconductor well region 32 is formed by introduction of first-conductivity type (e.g., p-type) impurities and the source/drain region 33 is formed by introduction of second-conductivity type (e.g., n-type) impurities. The photodiode (PD) and the source/drain region 33 of each pixel transistor are formed by ion implantation from the surface of the substrate 31.

The photodiode (PD) includes an n-type semiconductor region 34 and a p-type semiconductor region 35. Here, the p-type semiconductor region 35 is on the surface side of the substrate 31. On the surface of the substrate 31 forming the pixel, a gate electrode 36 is formed on a gate insulating layer. Pixel transistors Tr1 and Tr2 are formed by the gate electrode 36 and the paired source/drain regions 33. In FIG. 4, for simplifying the explanation, two pixel transistors Tr1 and Tr2 are illustrated on behalf of a plurality of pixel transistors. The pixel transistor Tr1 adjacent to the photodiode (PD) is equivalent to a transfer transistor and the source/drain region thereof is equivalent to a floating diffusion (FD). The unit pixels 30 are separated from one another by isolation regions 38 respectively. The isolation regions 38 are formed by LOCOS (Local Oxidation of Silicon), STI (Shallow Trench Isolation), or using an impurity diffusion layer having a conductivity type different from that of a diffusion layer formed as a node. LOCOS is a process where the semiconductor substrate 31 is oxidized to form a silicon oxide layer. STI is a process of providing trenches in the semiconductor substrate 31 and filling the trenches with a silicon oxide layer.

On the other hand, on the control circuit (control region) 24, MOS transistors that constitute a control circuit are formed on the semiconductor substrate 31. FIG. 4 illustrates the MOS transistors that constitute the control circuit (control region) 24, as represented by MOS transistors Tr3 and Tr4. Each of the MOS transistors Tr3 and Tr4 includes an n-type source/drain region 33 and a gate electrode 36 on a gate insulating layer.

Subsequently, a first insulating interlayer 39 is formed on the surface of the semiconductor substrate 31 and connection holes are then formed in the insulating interlayer 39, followed by the formation of connection conductors 44 connecting to the desired transistors through the connection holes. The formation of the connection conductors 44 with different heights may be performed by stacking a first insulation thin layer 43a, such as a silicon dioxide film, and a second insulation thin layer 43b, such as a silicon nitride film, on the entire surface of the semiconductor substrate 31 including the upper surfaces of the respective transistors. Here, the second insulation thin layer 43b acts as an etching stopper in an etching process for providing a contact hole connected to the gate electrode 36 and source/drain region 33 and afterward filled with a connection conductor 44. The first insulating interlayer 39 is formed on the second insulation thin layer 43b. Then, the connection holes with different depths are selectively formed in the first insulating interlayer 39, reaching to the second insulation thin layer 43b provided as the etching stopper. Subsequently, additional connection holes are formed in the respective portions of the first and second insulation thin layers 43a and 43b having the same film thickness by selective etching so that these additional connection holes can be communicated with the forgoing connection holes, respectively. After that, the connection conductor 44 is embedded in each of the resulting connection holes. In the case where the contact hole is provided without using the etching stopper, the second insulation thin layer 43b may not be formed.

Next, a plurality of layers is formed in the insulating interlayer 39 so that the layers can be connected to the respective connection conductors 44. In this example, but not limited to, a multi-wiring layer 41 is formed by the formation of three metal wiring layers 40. The metal wiring layer 40 is formed of a copper (CU) wiring line. In general, each copper wiring line is covered with a barrier metal layer that prevents Cu from dispersing. Thus, a cap layer, a so-called protective layer 42, of the copper wiring line 40 is formed on the multi-wiring layer 41. In the aforementioned steps, the first semiconductor substrate 31 having the half-finished pixel region 23 and control circuit 24 is formed.

Figure 5:
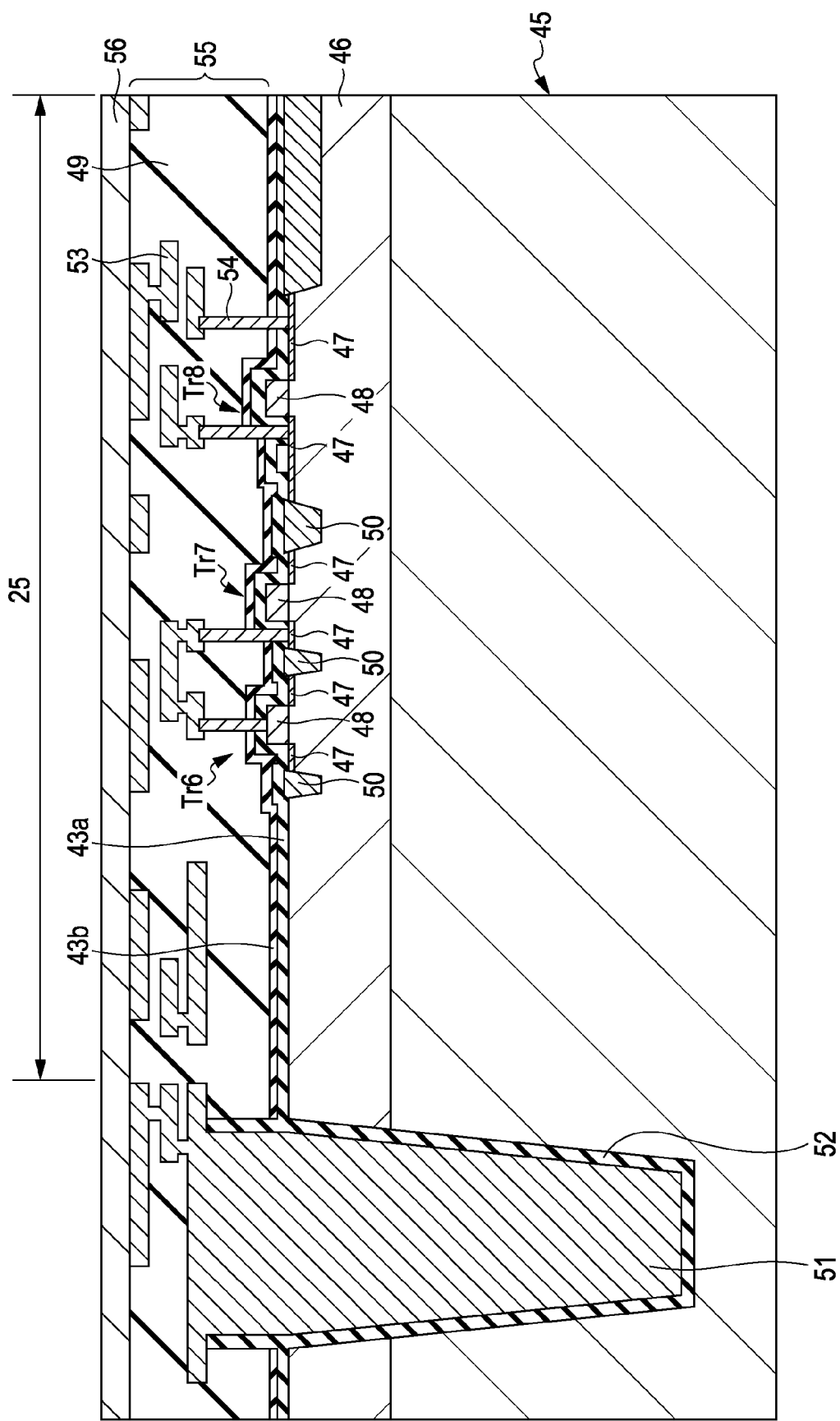
FIG. 5 is a diagram (second) illustrating the example of the method of manufacturing the solid-state imaging device according to the first embodiment of the present invention.

On the other hand, as shown in FIG. 5, a half-finished logic circuit 25 including a signal processing circuit for signal processing is formed on a region to be provided as each of microchip parts on a second semiconductor substrate (semiconductor wafer) 45. Furthermore, on a p-type semiconductor well region 46 on the surface side of the second semiconductor substrate (for example, the silicon wafer) 45, a plurality of MOS transistors, which forms a logic circuit, is formed so that the MOS transistors can be separated from each other by isolation regions 50, respectively. Here, the plurality of the MOS transistors is represented by MOS transistors Tr6, Tr7, and Tr8. Each of the MOS transistors Tr6, Tr7, and Tr8 is formed using a pair of n-type source/drain regions 47 and a gate electrode 48 formed on a gate insulation layer. The logic circuit 25 can be constructed of CMOS transistors.

Subsequently, a first insulating interlayer 49 is formed on the surface of the semiconductor substrate 45 and connection holes are then formed in the insulating interlayer 49, followed by the formation of connection conductors 54 connecting to the desired transistors through the respective connection holes. The formation of the connection conductors 54 with different heights may be performed by stacking a first insulation thin layer 43a, such as a silicon dioxide film, and a second insulation thin layer 43b, such as a silicon nitride film, are stacked on the entire surface of the semiconductor substrate 45 including the upper surfaces of the respective transistors. Here, the second insulation thin layer 43b acts as an etching stopper.

The first insulating interlayer 49 is formed on the second insulation thin layer 43b. Then, the connection holes with different depths are selectively formed in the first insulating interlayer 49, reaching to the second insulation thin layer 43b provided as an etching stopper. Subsequently, additional connection holes are formed in the respective portions of the first and second insulation thin layers 43a and 43b having the same film thickness by selective etching so that these additional connection holes can be communicated with the forgoing connection holes, respectively. After that, a connection conductor 44 is embedded in each of the resulting connection holes.

On the other hand, at a desired position on the area to be provided as each of microchip parts, a connection hole is formed from the surface of the first insulating interlayer 49 to a predetermined depth position in the semiconductor substrate 45. Then, a connection conductor 51 for extraction electrode is embedded in the resulting connection hole. The connection conductor 51 may be made of copper (Cu), tungsten (W), polysilicon, or the like. Before embedding the connection conductor 51, an insulation layer 52 is formed on the inner wall surface of the connection hole to insulate the connection conductor 51 from the semiconductor substrate 45.

Next, a plurality of layers is formed through the insulating interlayer 49 so that they can be connected to the respective connection conductors 54 and the extraction connection conductor 51. In this example, but not limited to, a multi-wiring layer 55 is formed by the formation of three metal wiring layers 53. The metal wiring layer 53 is formed of a copper (CU) wiring line. In a manner similar to one described above, a cap layer, a so-called protective layer 56, of the copper wiring line 53 is formed on the multi-wiring layer 49. In the aforementioned steps, the first semiconductor substrate 45 having the half-finished logic circuit 25 is formed.

Figure 6:
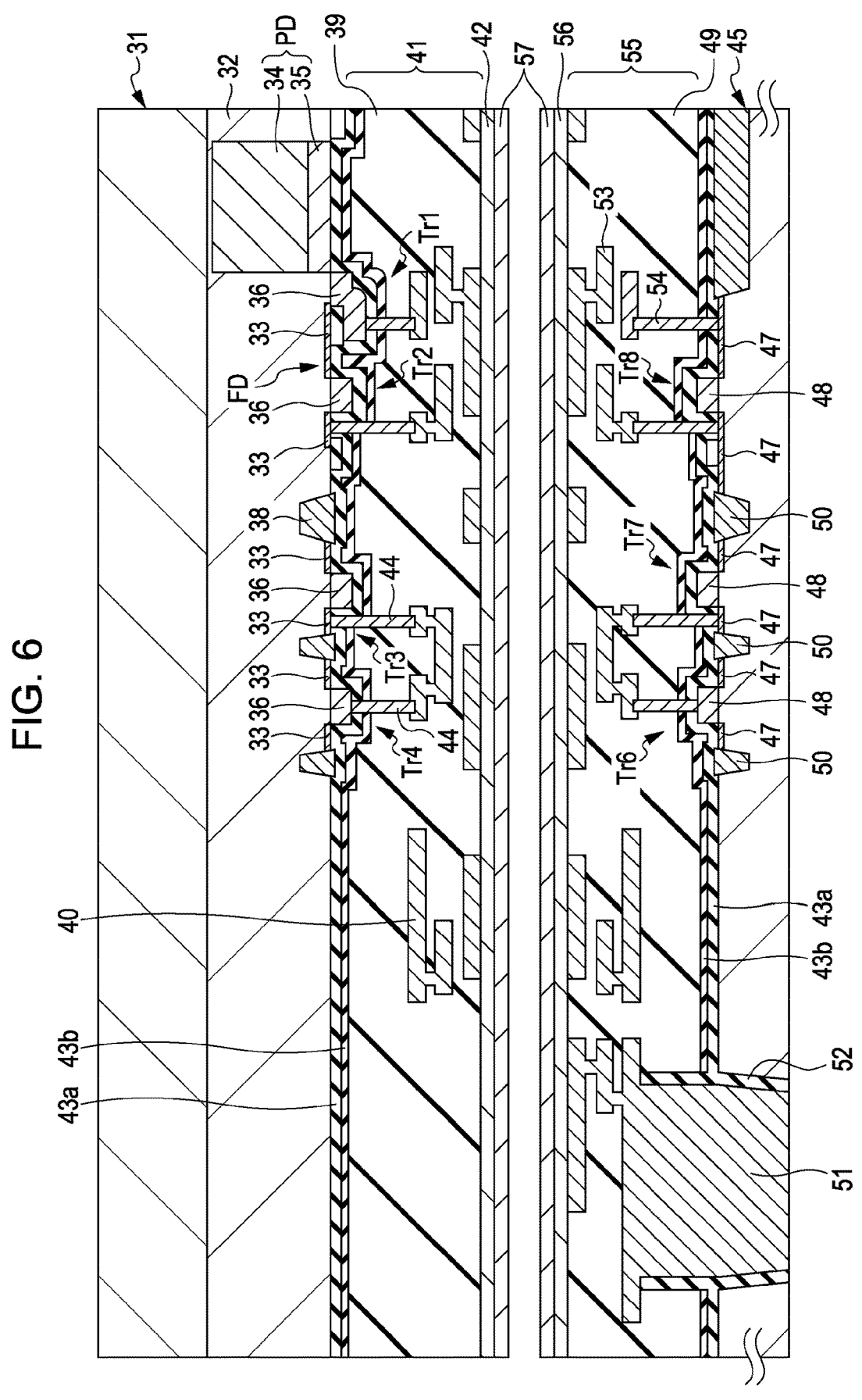
Figure 7:
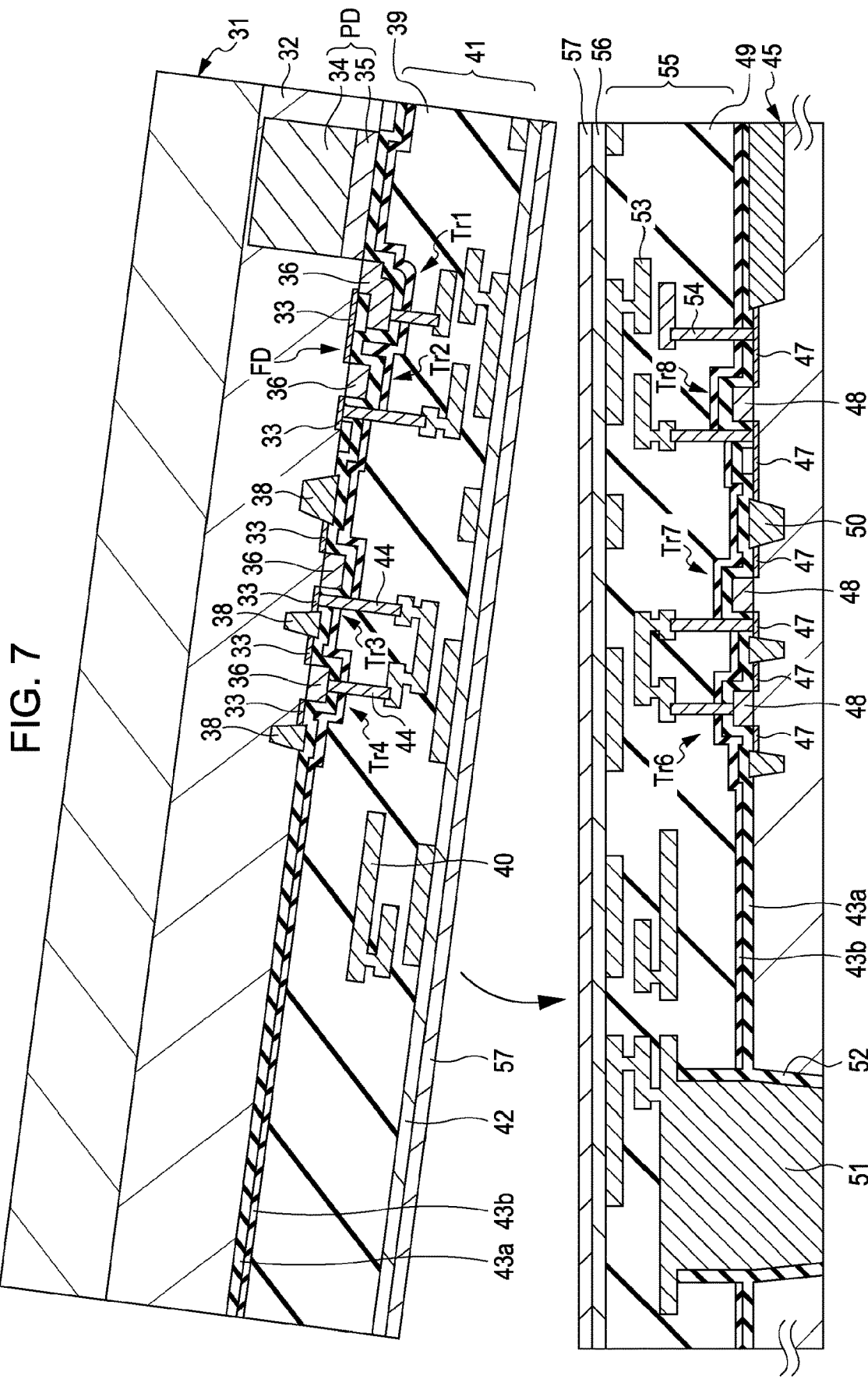
FIG. 7 is a diagram (fourth) illustrating the example of the method of manufacturing the solid-state imaging device according to the first embodiment of the present invention.

Next, as shown in FIG. 6, the first semiconductor substrate 31 and the second semiconductor substrate 45 are bonded together so that their respective multi-wiring layers 41 and 55 can be faced with each other. The bonding may be performed using plasma bonding, an adhesive agent, or the like. In the case of the plasma bonding, as shown in FIG. 7, a layer 57, such as a plasma TEOS film, a plasma SiN film, a SiON film (block film), or a SiC film, is formed on the bonding surface of each of the first and second semiconductor wafers 31 and 45.

Figure 8:
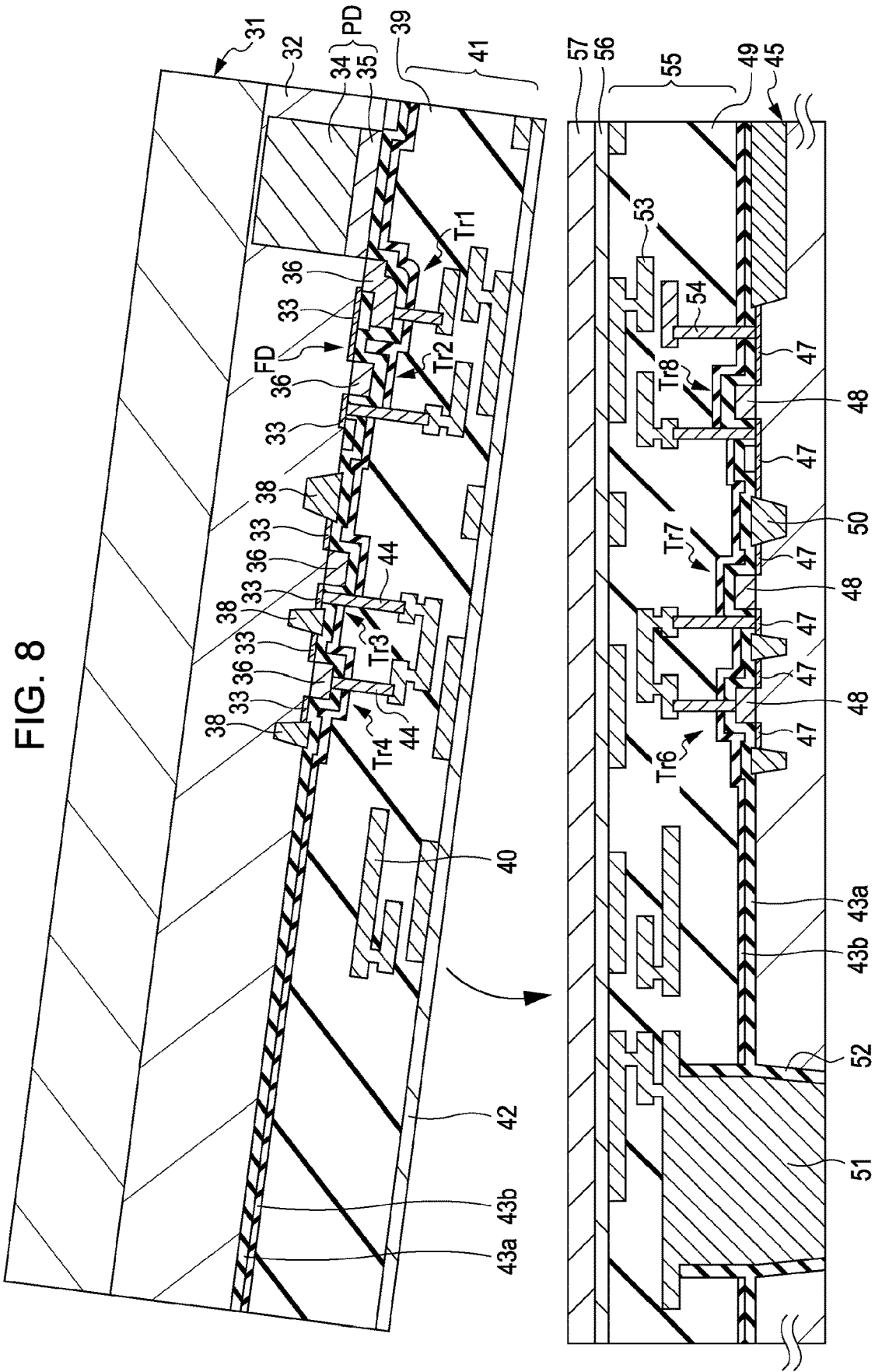
FIG. 8 is a diagram (fifth) illustrating the example of the method of manufacturing the solid-state imaging device according to the first embodiment of the present invention.

The bonding surfaces with the layers 57 are subjected to a plasma treatment and then placed over one another, followed by being bonded by an annealing treatment. Such bonding processing is preferably performed using a low-temperature process at 400° C. or less. Such a range of the temperature will not affect on the bonding processing, wiring, or the like. In the case of the adhesive agent, as shown in FIG. 8, an adhesive layer 58 is formed on one of the bonding surfaces of the first and second semiconductor wafers 31 and 45 and both the wafers are then placed over one another through the adhesive layer 58. In this example, the bonding is performed using the plasma bonding.

Figure 9:
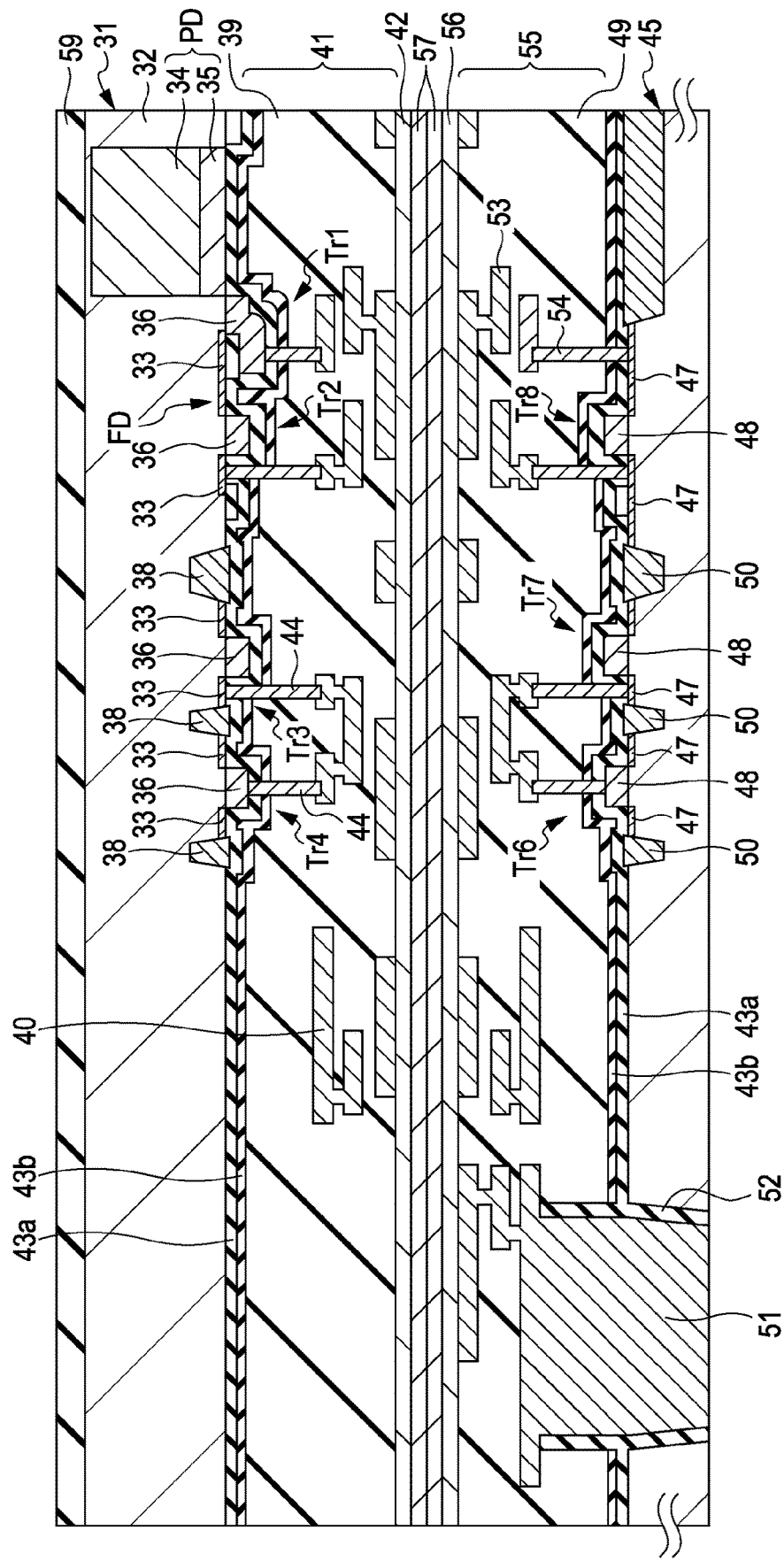
FIG. 9 is a diagram (sixth) illustrating the example of the method of manufacturing the solid-state imaging device according to the first embodiment of the present invention.

Next, as shown in FIG. 9, grinding and polishing are performed from the back side 31b of the first semiconductor substrate 31 to make the first semiconductor substrate 31 into a thin film. The thin-film processing is performed to close in the photodiode (PD). After the thin-film processing, a p-type semiconductor layer for dark current control is formed on the back side of the photodiode (PD).

For example, the semiconductor substrate 31 with a thickness of about 600 μm may be thinned to about 1 to 10 μm, preferably about 1 to 5 μm. The thin-film processing has been commonly performed using a separately prepared supporting substrate for bonding them together. In the embodiment, however, the second semiconductor substrate 45 on which the logic circuit 25 is formed is also used as a supporting substrate to make the first semiconductor substrate 31 into a thin film. After the thin-film processing, an insulating interlayer 59, such as a silicon dioxide film, is formed on the backside of the substrate 31. In the back-illuminated solid-state imaging device, the back side 31b of the first semiconductor substrate 31 serves as a light-incident surface.

Figure 10:
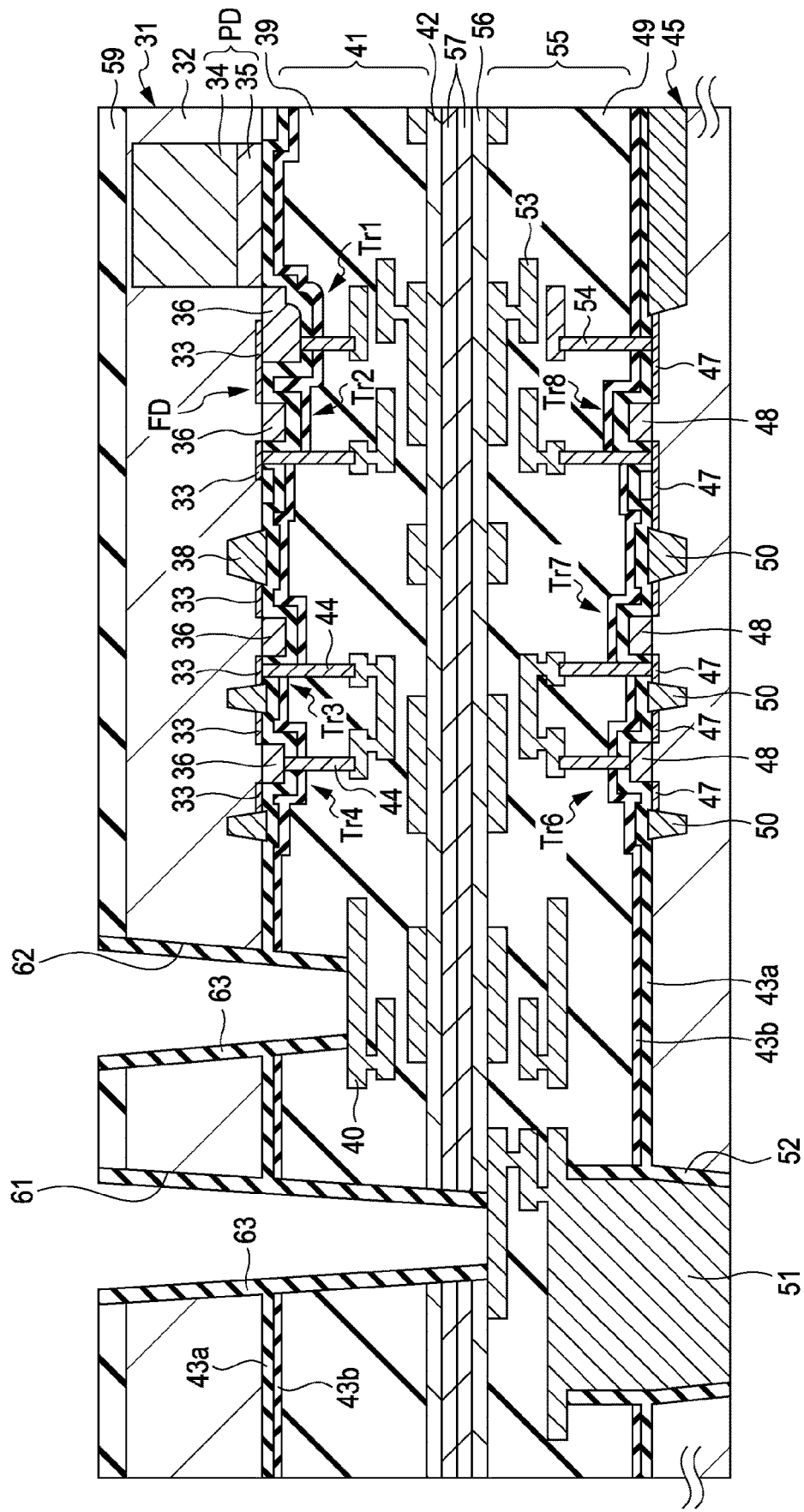
FIG. 10 is a diagram (seventh) illustrating the example of the method of manufacturing the solid-state imaging device according to the first embodiment of the present invention.

Next, as shown in FIG. 10, a connection through-hole 61 is formed in the thin-filmed first semiconductor substrate 31 at a desired position of a region to be provided as each microchip part. The connection through-hole 61 extends from the back side 31b to the uppermost layer of the wiring 53 of the second semiconductor substrate 45 through the first semiconductor substrate 31. Simultaneously, a connection hole 62 is formed near the connection through-hole 61 in the first semiconductor substrate 31, extending from the back side 31b to the first layer wiring 40 on the first semiconductor substrate 31. Each of the connection through-hole 61 and connection hole 62 may have a contact area of 1 to 5 μm in diameter. Since the connection through-hole 61 and the connection hole 62 are formed after making the first semiconductor substrate 31 into a thin film, these holes 61 and 62 can be formed as micropores with a smaller aspect ratio. For example, each of the connection through-hole 61 and the connection hole 62 may have a contact depth of about 5 to 15 μm. Subsequently, an insulating layer 63 for electric insulation with the semiconductor substrate 31 is formed on the inner wall surface of each of the connection through-hole 61 and the connection hole 62.

At this time, the process for manufacturing a pixel array is incomplete because the steps of forming an on-chip color filter and an on-chip microlens are still untouched. In addition, both the connection holes 61 and 62 may be processed and formed in the extension of the typical wafer process. In the case of the logic circuit, the process up to the uppermost layer wiring 53 suitable for a circuit technology has been completed, but the whole manufacturing process has not been completed. Therefore, a decrease in manufacturing cost can be attained.

Figure 11:
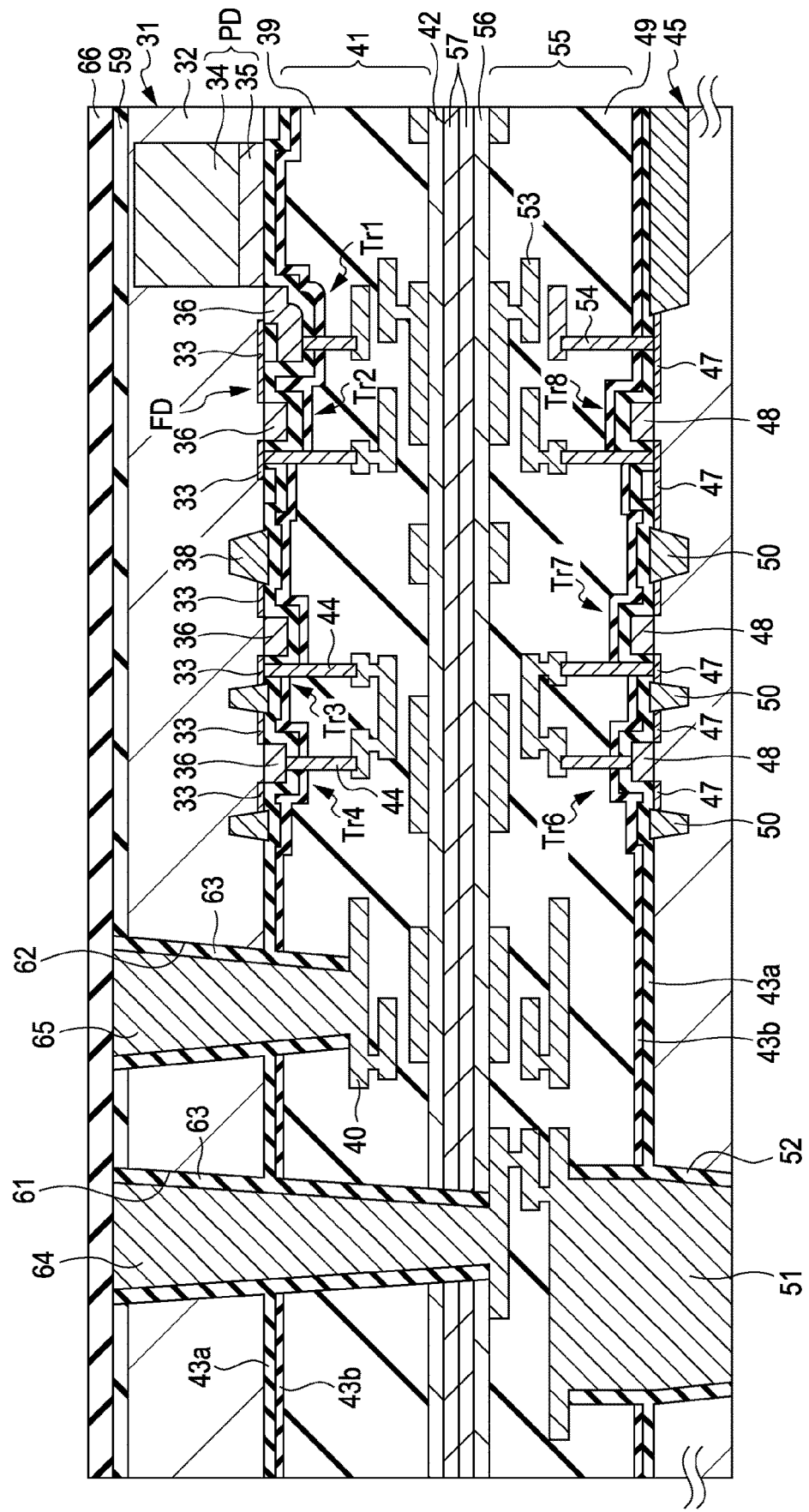
FIG. 11 is a diagram (eighth) illustrating the example of the method of manufacturing the solid-state imaging device according to the first embodiment of the present invention.

Next, as shown in FIG. 11, a through-connection conductor 64 and a connection conductor 65 are embedded in the connection through-hole 61 and the connection hole 62, respectively. Each of the through-connection conductor 64 and the connection conductor 65 may be made of a metal, such as copper (Cu) or tungsten (W). After that, an insulating protective layer 66 is formed on the entire back side of the first semiconductor substrate 31. The insulating protective layer 66 may be made of, for example, a SiCN film, a plasma silicon nitride film, or a SiC film.

Figure 12:
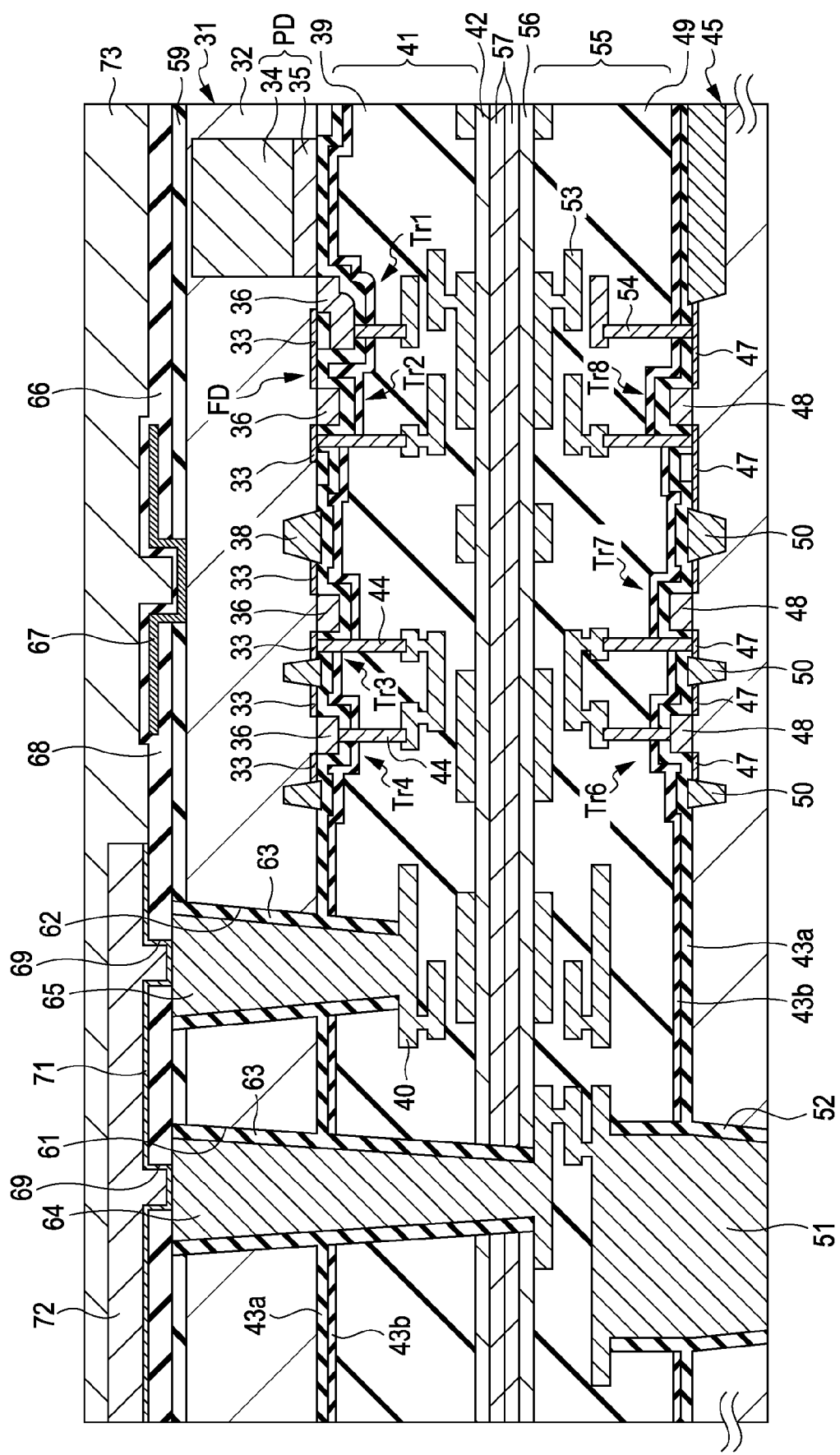
FIG. 12 is a diagram (ninth) illustrating the example of the method of manufacturing the solid-state imaging device according to the first embodiment of the present invention.

Next, as shown in FIG. 12, a light-shielding layer 67 is formed on a region to be shielded from light. In this figure, the light-shielding layer 67 is formed above the control circuit 24. Alternatively, it may be also formed above other pixel transistors. The light-shielding layer 67 may be a metal layer such as a tungsten film. The light-shielding layer 67 is electrically connected to the semiconductor well region 32 having a ground potential and prevented from being in an electrically floating state. In addition, since the light-shielding layer 67 electrically connected to the semiconductor well region 32 is provided with the ground potential, the semiconductor well region 32 is prevented from being in an electrically floating state. A passivation layer 68 is formed on the whole surface of the light-shielding layer 67 so that it entirely covers the light-shielding layer 67. The passivation layer 68 may be, for example, a plasma silicon nitride film or a CVD-SiV film. Subsequently, connection holes 69 are formed in the portions of the passivation layer 68 and the insulating protective layer 66, which correspond to the through-connection conductor 64 and the connection conductor 65, respectively. Then, connection wiring 72, an aluminum film, is formed on a barrier metal layer 71 on the connection hole 69. The barrier metal layer 71 is formed, for example, by a stacked film of Ti (downside)/TiN (upside). The connection wiring 72 is connected to both the through-connection conductor 64 and the connection conductor 65 through the barrier metal layer 71. The connection wiring 72 is used for connecting the pixel region 23 and the control circuit 24 to the logic circuit 25 and serves as an extraction electrode from the upper side, or serves as a so-called electrode pad. Hereinafter, the connection wiring 72 is also referred to as an electrode pad.

Therefore, an image sensor constructed of the image region 23 and the control circuit 24 formed on the first semiconductor substrate 31 is electrically connected to the logic circuit 25 formed on the second semiconductor substrate 45 through the connection conductor 65, the electrode pad 72, and the through-connection conductor 64.

After that, a planarizing layer 73 is formed on these structural components.

Figure 13:
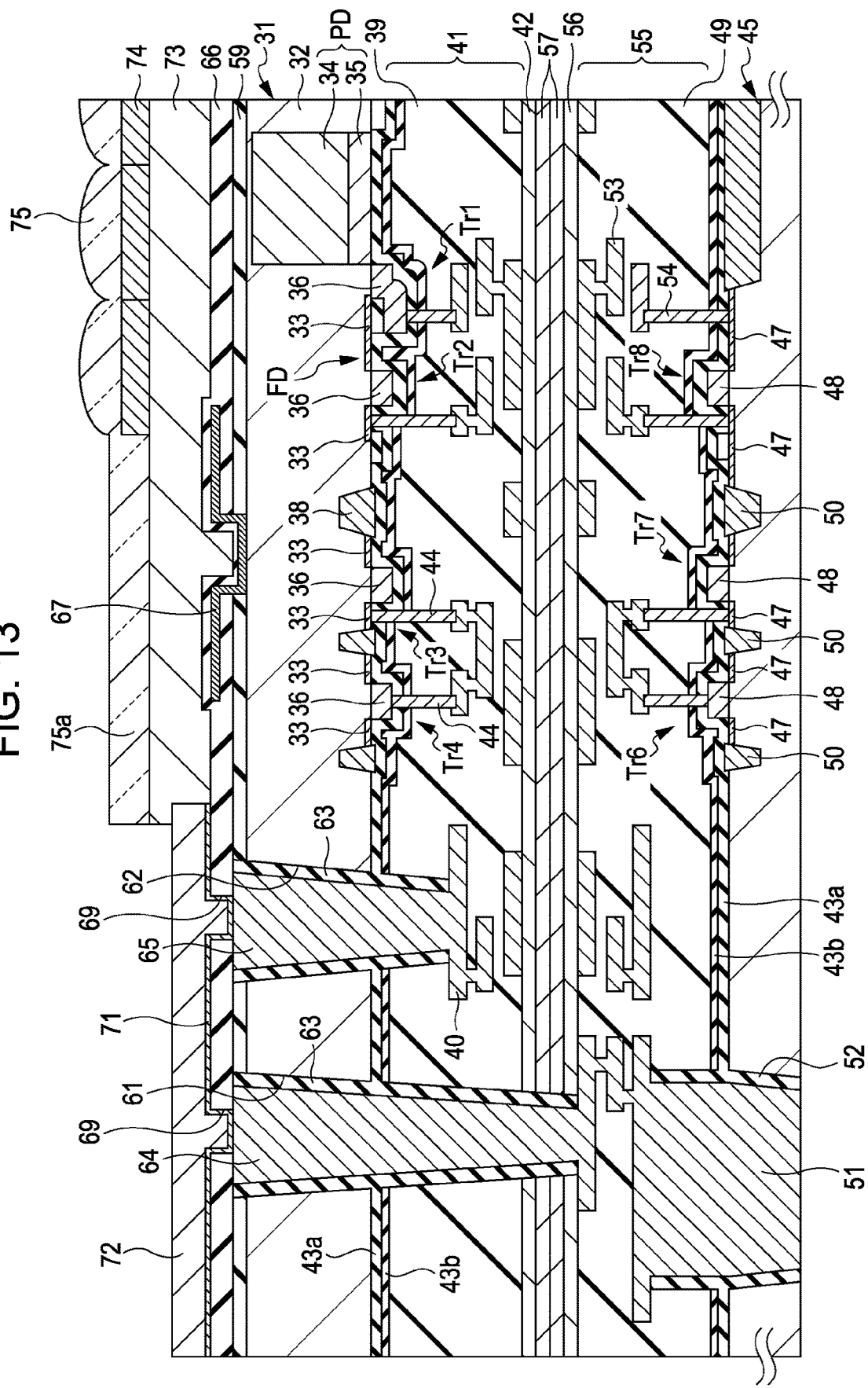
FIG. 13 is a diagram (tenth) illustrating the example of the method of manufacturing the solid-state imaging device according to the first embodiment of the present invention.

Next, as shown in FIG. 13, red (R), green (G), and blue (B) on-chip color filters 74 are formed on the planarizing layer 73, corresponding to the respective pixels, and on-chip microlenses 75 are then formed on the respective color filters 74. In other words, both the on-chip color filters 74 and the on-chip microlenses 75 are formed so that each of them corresponds to each unit pixel of the pixel array.

Here, to facilitate understanding of the embodiments of the present invention, FIG. 12 is an enlarged cross-sectional diagram illustrating the configuration of the substrate, but the on-chip color filters 74 and on-chip microlenses 75 are not shown in the figure. Thus, the pitch sizes of the on-chip color filters 74 and the on-chip microlenses 75 are reduced with reference to the pitch size of the unit pixels.

Next, although not illustrated in FIG. 13, the electrode pad 72 is exposed by selectively removing a lens material layer 75a and the planarizing layer 73. On the other hand, on the side of the second semiconductor substrate 45, the surface of the substrate 45 is ground and polished to expose the surface of the connection conductor 51 that serves as an extraction electrode. After forming a passivation layer 76 on the exposed surface of the connection conductor 51 of the second semiconductor substrate 45, an opening 77 corresponding to the connection conductor 51 is formed in the passivation layer 76. A spherical electrode bump 78 is formed so that it can be electrically connected to the connection conductor 51 through the opening 77 (see FIG. 3). In the first semiconductor substrate 31, therefore, both the pixel region 23 and the control circuit 24 are brought into a finished product state. In the second semiconductor substrate 45, the logic circuit 25 is brought into a finished product state.

Figure 3:
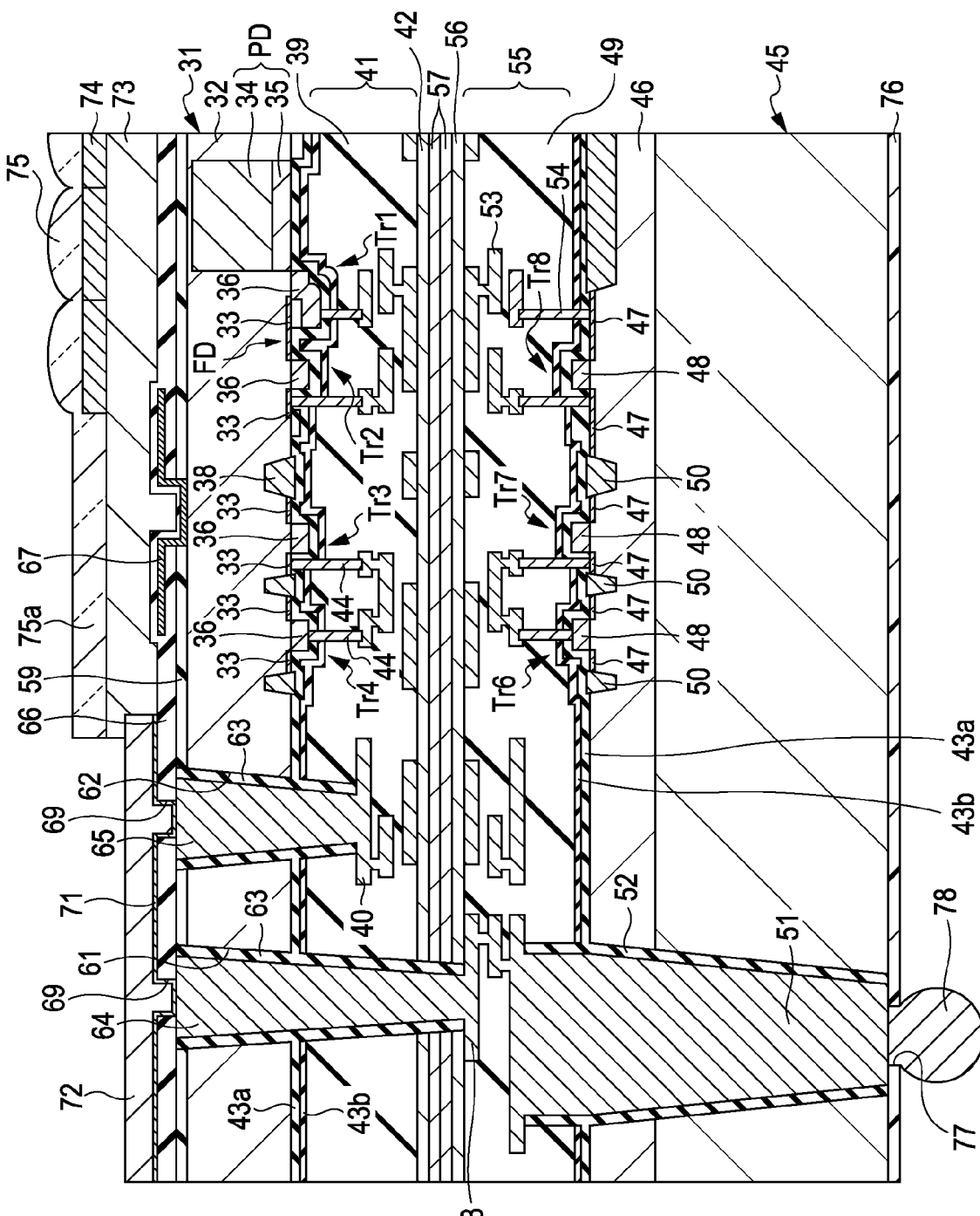
FIG. 3 is a schematic diagram illustrating a main part of the solid-state imaging device according to a first embodiment of the present invention.

Subsequently, the resulting product is divided into the respective microchips, thereby obtaining a desired back-illuminated solid-state imaging device 79 as shown in FIG. 3.

In the solid-state imaging device 79 of the first embodiment, if the electrode pad 72 is used, the device 79 can be electrically connected to external wiring by wire bonding to the electrode pad 72. If the electrode bump 78 is used, the device 78 can be electrically connected to external wiring by face-down bonding. The user may choose one of the electrode pad 72 and the electrode bump 78 according to user's wishes.

In the first embodiment, the sold-state imaging device can be inspected using the electrode pad 72 with respect to the semiconductor wafers. In addition, the inspection includes two inspection steps, one in the state of wafer and the other in the final module state after cutting into chips.

According to the solid-state imaging device 79 and the manufacturing method thereof according to the first embodiment of the present invention, both the pixel region 23 and the control circuit 24 are formed on the microchip part from the first semiconductor substrate 31. In addition, the logic circuit 25 for signal processing is formed on the microchip part from the second semiconductor substrate 45.

In this way, the functions of the pixel array and the functions of the logic circuit are assigned on different microchip parts, so that suitable processing technologies can be individually applied to the pixel array and the logic circuit. Therefore, the performances of the pixel array and the logic circuit can be efficiently exerted. Thus, a high-performance solid-state imaging device can be provided.

In the case of the configuration of the device shown in FIG. 2C, only the pixel region 23 for receiving incident light may be formed on the side of the semiconductor chip section 22. Thus, the control circuit 24 and the logic circuit 25 can be separately formed on the semiconductor chip section 26. Therefore, processing technologies suitable for the respective functional microchips can be independently selected while the surface area of the product module can be also reduced.

Since the pixel array and the logic circuit can be mounted in combination using the typical wafer-processing technology, the production of the device can be also facilitated.

The first semiconductor substrate 31 having the pixel region 23 and the control circuit 24 in a half-finished state and the second semiconductor substrate 45 having the logic circuit 25 in a half-finished state are attached together, followed by making the first semiconductor substrate 31 into a thin film. In other words, the second semiconductor substrate 45 may be used as a supporting substrate for making the first semiconductor substrate 31 into a thin film. Therefore, it becomes possible to reduce the number of structural members and reduce the number of manufacturing steps. Furthermore, since the connection through-hole is formed during the thin-film formation, the aspect ratio of the hole can be reduced and the formation of connection holes can be performed with high accuracy. Furthermore, the through-connection conductor 61 and the connection conductor 62 are embedded into the connection through-hole and the connection hole of small aspect ratios. Therefore, the metal materials which can be used may include those with low coatability, such as copper (Cu), as well as those with high coatability, such as tungsten (W). In other words, the connection conductor materials hardly impose restrictions on the device. Thus, the pixel region and the control circuit can be electrically connected to the logic circuit with high precision. Therefore, it becomes possible to manufacture a high performance solid-state imaging device with high mass productivity while keeping production costs down.

3. Second Embodiment

[Example of Configuration of Solid-State Imaging Device]

Figure 14:
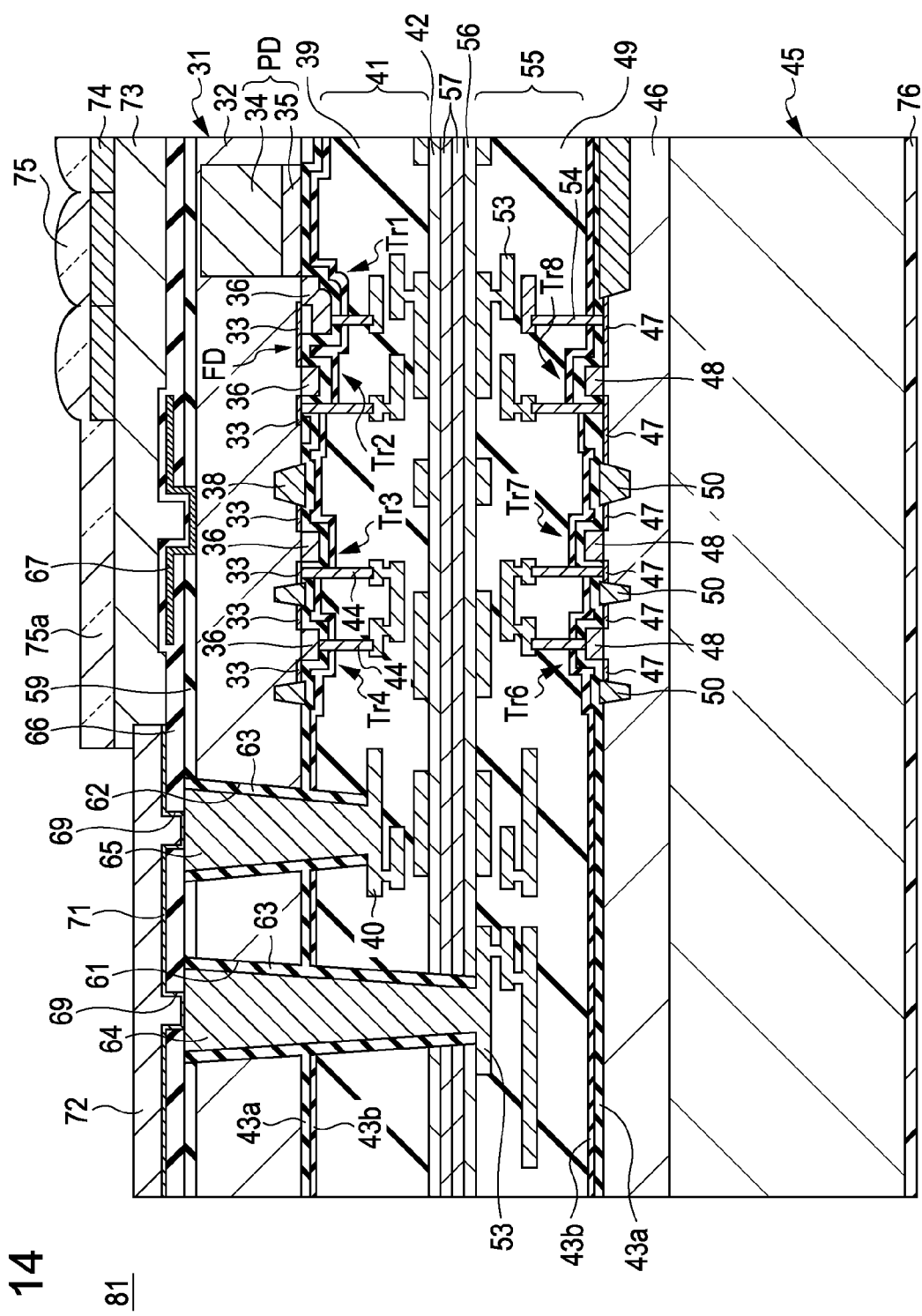
FIG. 14 is a diagram illustrating a solid-state imaging device according to a second embodiment of the present invention.

Referring now to FIG. 14, a solid-state imaging device (i.e., a MOS solid-state imaging device) according to a second embodiment of the present invention will be described. The solid-state imaging device 81 according to the second embodiment of the present invention is constructed in a manner similar to that of the first embodiment, except for the followings: In this embodiment, only the electrode pad 72 on the side of the first semiconductor substrate 31 is formed, while the connection conductor 51, the insulating layer 52, and the electrode bump 78 on the side of the second semiconductor substrate 45 are omitted. In addition, a passivation layer 76 is formed on the back side of the second semiconductor substrate 45. Other structural components are the same as those described in the first embodiment. Therefore, the corresponding structural components are designated by the same reference numerals as those in FIG. 3 to omit the duplicated explanations thereof. In addition, the manufacture of the solid-stage imaging device 81 is performed by the same method as that of the first embodiment shown in FIG. 4 to FIG. 13, except for the followings: The method of the present embodiment does not include the steps of forming the connection conductor 51, the insulating layer 52, and the electrode bump 78 as well as the formation of the connection hole desired for forming the connection conductor 51.

The solid-state imaging device of the second embodiment exerts the same advantageous effects as those of the first embodiment because of having the similar configuration to that of the first embodiment except for the electrode bump 78. In the second embodiment, the connection hole, the insulating layer 62, and the connection conductor 61 are not formed on the side of the logic circuit in advance. Thus, lower costs can be expected.

4. Third Embodiment

[Example of Configuration of Solid-State Imaging Device]

Figure 15:
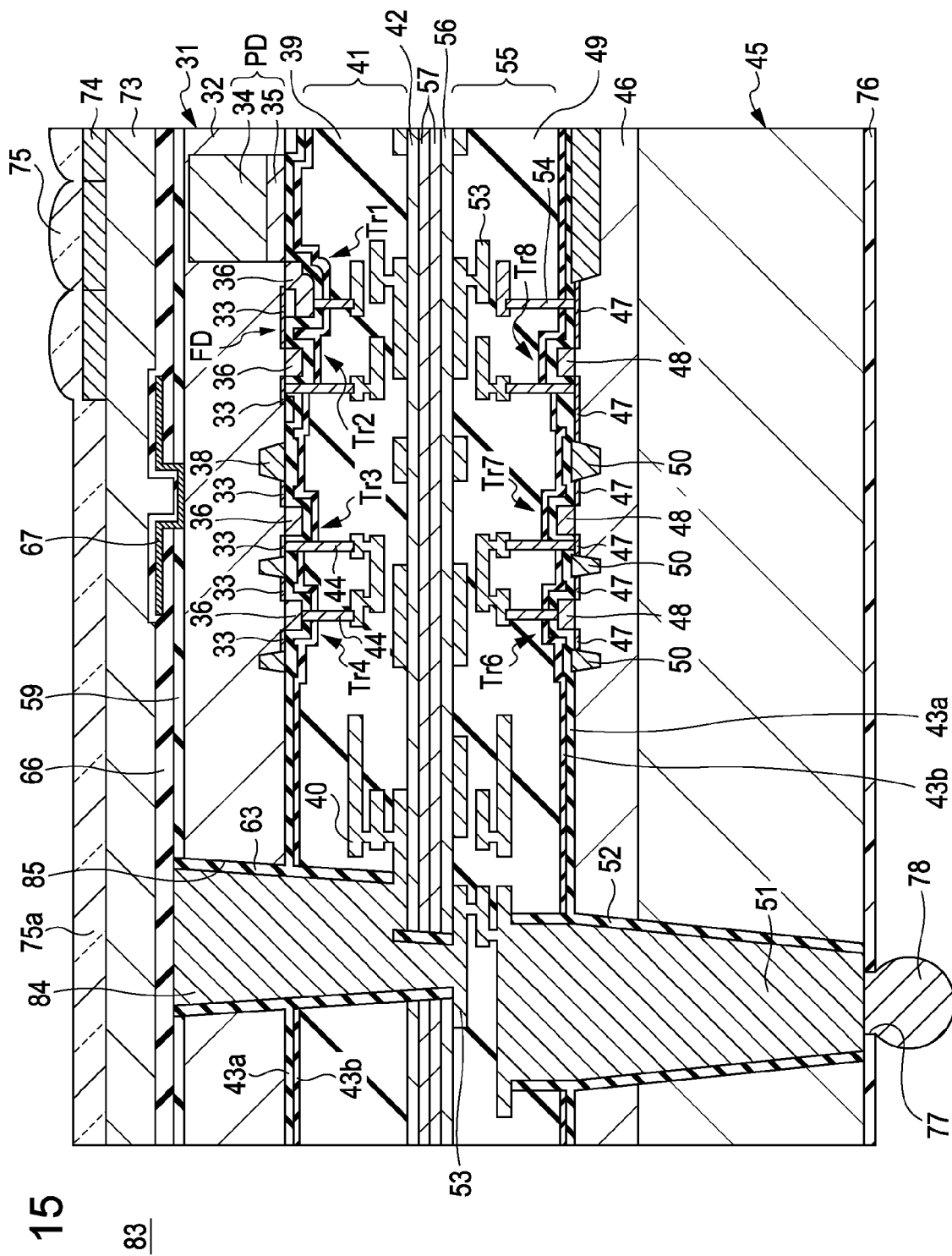
FIG. 15 is a diagram illustrating a solid-state imaging device according to a third embodiment of the present invention.

Referring now to FIG. 15, a semiconductor device (i.e., a MOS solid-state imaging device) according to a third embodiment of the present invention will be described. In the solid-state imaging device 83 of the third embodiment, the pixel region 23 and the control circuit 24 formed on the side of the first semiconductor substrate 31 are electrically connected to the logic circuit 25 on the side of the second semiconductor substrate 45 through one through-connection conductor 84 formed in the first semiconductor substrate 31.

In other words, a connection through-hole 85 is formed such that it extends from the back side 31b of the first semiconductor substrate to the uppermost layer of the wiring 53 of the second semiconductor substrate 45 through the first semiconductor substrate 31. In addition, part of the connection through-hole 85 reaches to the uppermost layer of the wiring 40 of the first semiconductor substrate 31. After the formation of the insulating layer 63 on the inner wall surface of the connection through-hole 85, the through-connection conductor 84 is embedded in the connection through-hole 85 to connect the wiring 40 on the side of the pixel region 23 and the control circuit 24 to the wiring 53 on the side of the logic circuit 25. In the above first embodiment, the connection conductor 65 is connected to the first layer of the wiring 40 while the connection conductor 65 serves as a connection end. However, in the second embodiment, the through-connection conductor 84 is connected to the uppermost layer of the wiring 40. The respective layers of the wiring 40 are connected to one another so that the uppermost layer thereof connected to the through-connection conductor 84 will serve as a connection end.

In the present embodiment, the pixel region 23 and the control circuit 24 are connected to the logic circuit 25 through one through-connection conductor 84. Thus, an electrode pad 72 that serves as the uppermost layer of the connection wiring as described in the first embodiment is not formed.

Other structural components are the same as those described in the first embodiment. Therefore, the corresponding structural components are designated by the same reference numerals as those in FIG. 3 to omit the duplicated explanations thereof. In addition, the manufacture of the solid-stage imaging device 83 is performed by the same method as that of the first embodiment shown in FIG. 4 to FIG. 13, except for the steps of forming the connection conductor 65 and the electric pad 72 and the steps of selectively etching the lens material layer 75a and the planarizing layer 73.

In the third embodiment, the sold-state imaging device can be inspected using the electrode pump from the connection conductor 51.

According to the solid-state imaging device 83 of the third embodiment, the pixel region 23 and the control circuit 24 are electrically connected to the logic circuit 25 through one through-connection conductor 84. In addition, the electrode pad 72 is omitted. Thus, the configuration of the device is simplified compared with that of the first embodiment. Furthermore, the number of the manufacturing steps can be reduced. Therefore, a further reduction in manufacturing costs can be attained. In addition, the same effects as those described in the first embodiment can be exerted.

5. Fourth Embodiment

[Example of Configuration of Solid-State Imaging Device and Example of Manufacturing Method Thereof]

Referring now to FIG. 16 and FIGS. 17 to 21, a semiconductor device (i.e., a MOS solid-state imaging device) according to a fourth embodiment of the present invention and a manufacturing method thereof will be described.

Figure 17:
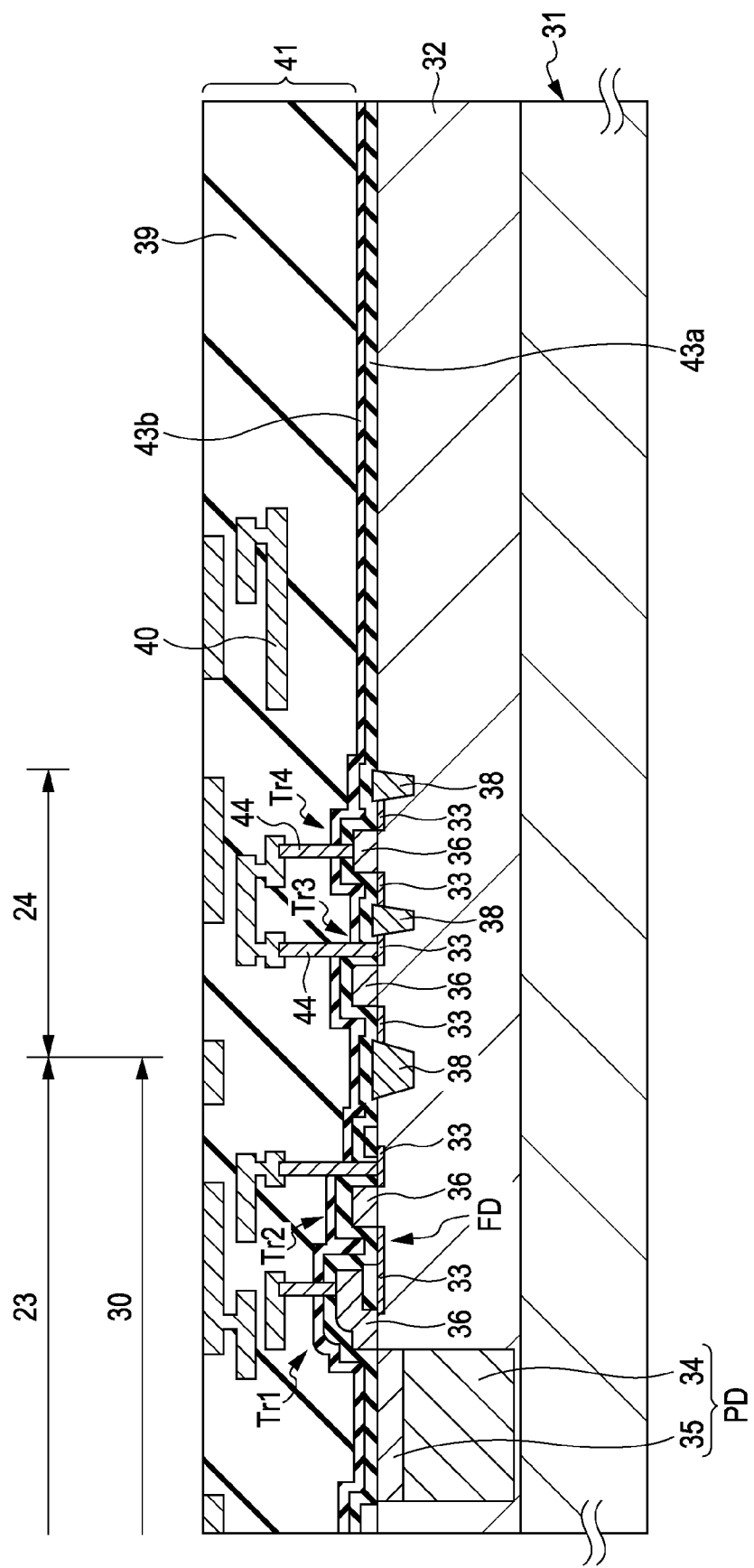
FIG. 17 is a diagram (first) illustrating the example of the method of manufacturing the solid-state imaging device according to the fourth embodiment of the present invention.

In the fourth embodiment, first, as shown in FIG. 17, a half-finished image sensor, or a pixel region 23, and a control circuit 24 are formed on a region to be provided as each microchip part of a first semiconductor substrate 31. The manufacturing steps in the present embodiment are the same as those illustrated in FIG. 4 of the aforementioned first embodiment. The same reference numerals as in FIG. 4 are used to denote the corresponding or similar portions. Thus, redundant descriptions will be omitted. However, in the present embodiment, the multi-wiring layer 41 is formed on the first semiconductor substrate 31. However, the process is completed at the time of forming the uppermost layer of the wiring 40. In other words, the process is completed when the uppermost layer of the wiring 40 is exposed. The protective layer 42 shown in FIG. 4 is not formed on the exposed layer.

Figure 18:
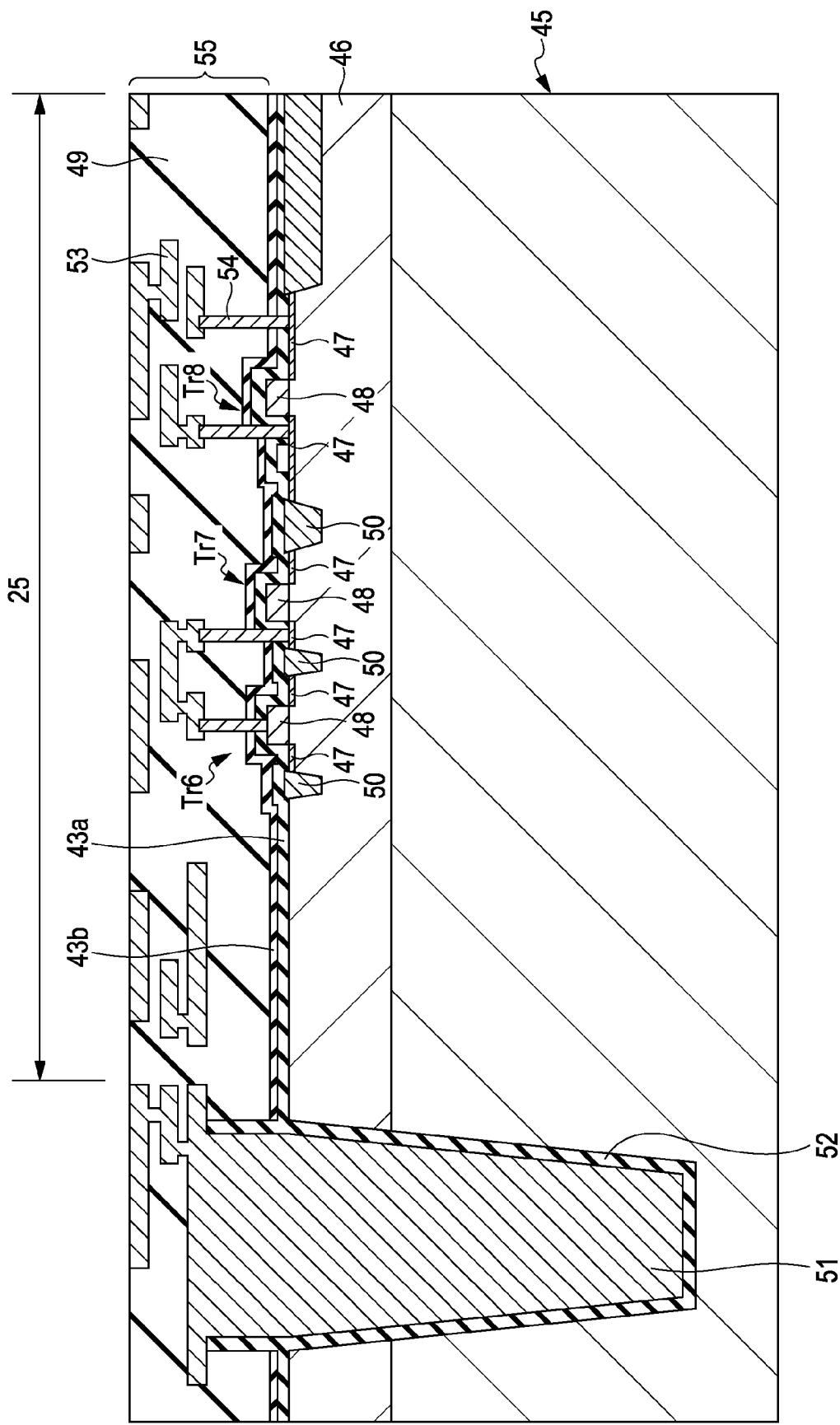
FIG. 18 is a diagram (second) illustrating the example of the method of manufacturing the solid-state imaging device according to the fourth embodiment of the present invention.

On the other hand, as shown in FIG. 18, a half-finished logic circuit 25 for signal processing circuit is formed on a region to be provided as each of microchip parts on a second semiconductor substrate 45. The manufacturing steps in the present embodiment are the same as those illustrated in FIG. 5 of the aforementioned first embodiment. The same reference numerals as in FIG. 5 are used to denote the corresponding structural components. Thus, redundant descriptions will be omitted. However, in the present embodiment, the multi-wiring layer 55 is formed on the second semiconductor substrate 45 and the process is completed at the time of forming the uppermost layer of the wiring 53. In other words, the process is completed when the uppermost layer of the wiring 53 is exposed. The protective layer 56 shown in FIG. 5 is not formed on the exposed layer.

Figure 19:
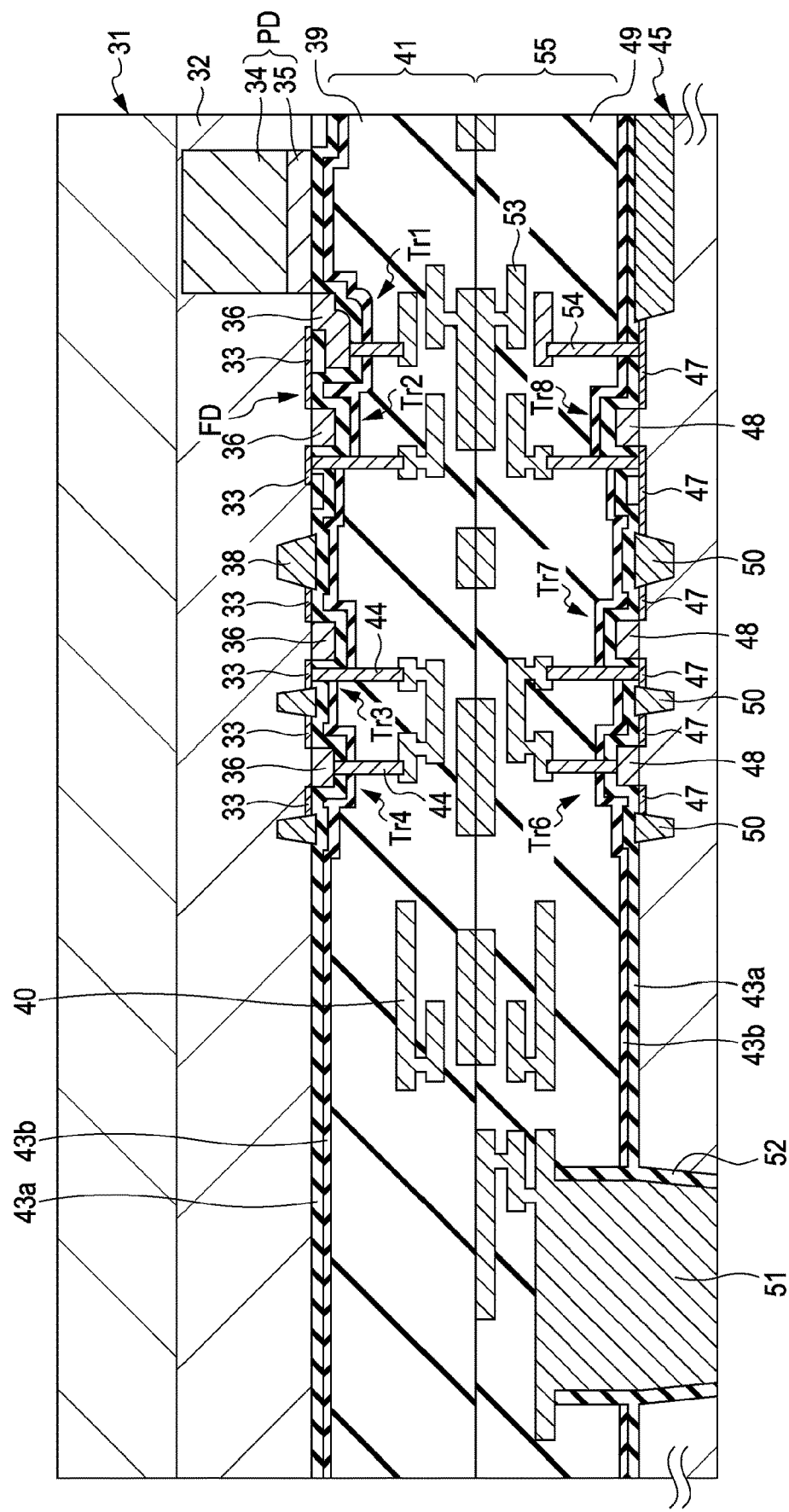
FIG. 19 is a diagram (third) illustrating the example of the method of manufacturing the solid-state imaging device according to the fourth embodiment of the present invention.

Next, as shown in FIG. 19, the first semiconductor substrate 31 and the second semiconductor substrate 45 are bonded together so that their respective multi-wiring layers 41 and 55 can be faced with each other, while their wiring 40 and 53 are connected to each other and their insulating interlayers 39 and 49 are connected to each other.

In this bonding process, the wiring 40 and 53 are copper (Cu) wiring and the insulating interlayers 39 and 40 are silicon dioxide films. Furthermore, both the semiconductor substrates 31 and 45 are placed over one another and heated while receiving a predetermined load while their respective Cu wirings 40 and 50 are directly touched with each other. Simultaneously, the insulating interlayers 39 and 49 may be connected with each other. The heating temperature at this time is, for example, about 300° C., which prevents Cu wiring from being deteriorated.

Figure 20:
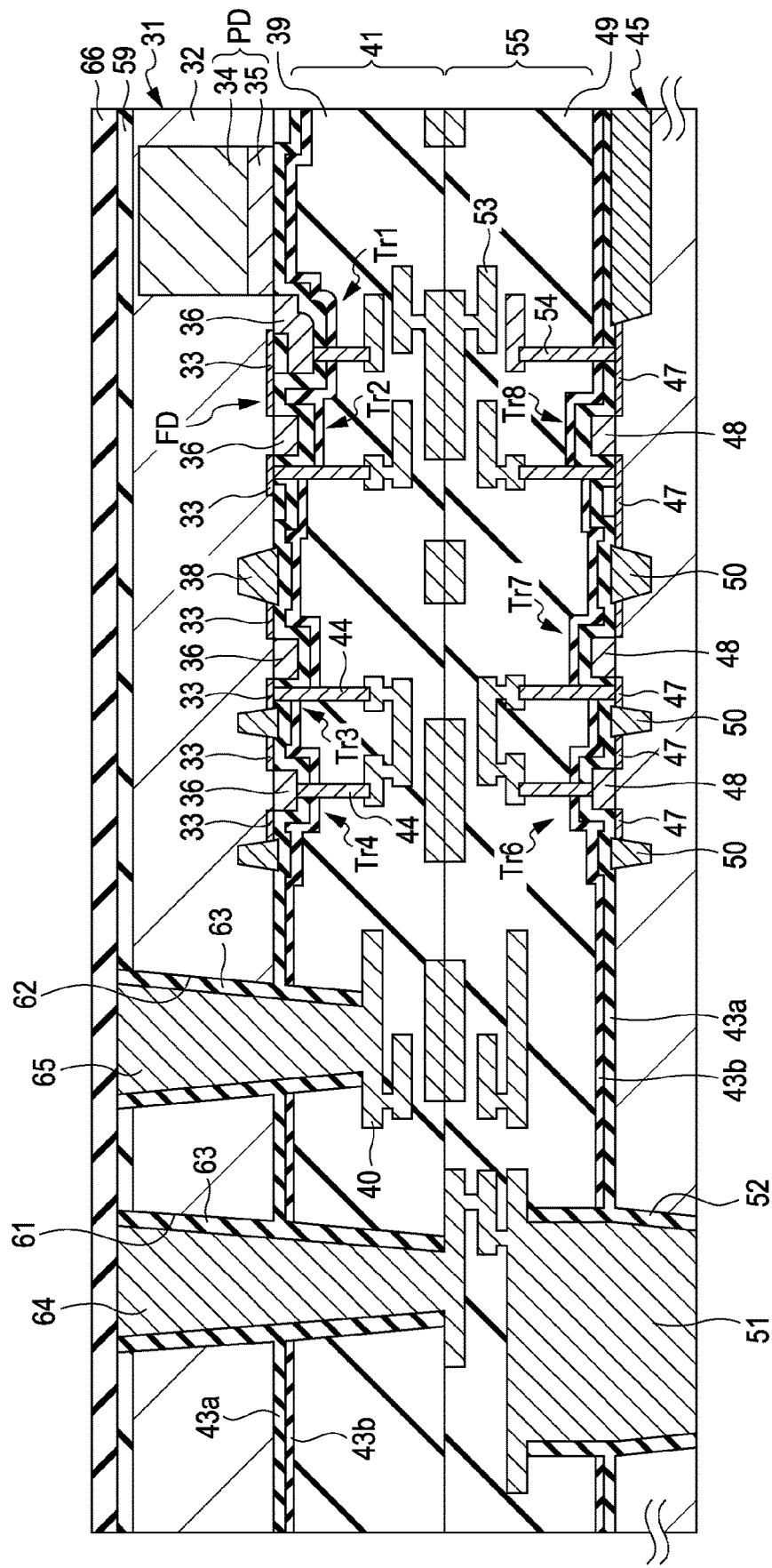
FIG. 20 is a diagram (fourth) illustrating the example of the method of manufacturing the solid-state imaging device according to the fourth embodiment of the present invention.

Next, as shown in FIG. 20, grinding and polishing are performed from the back side 31b of the first semiconductor substrate 31 to thin the first semiconductor substrate 31. The thin-film processing is performed to close in the photodiode (PD). After the thin-film formation, an insulating interlayer 59, such as a silicon dioxide film, is formed on the backside of the substrate 31. Subsequently, a connection hole 88 is formed in the thin-filmed first semiconductor substrate 31. The connection hole 88 is located at a desired position in a region to be provided as each microchip part and extends from the back side 31b of the substrate 31 to the first layer of the wiring 40. An insulating layer 63 is formed on the inner wall surface of the connection hole 88. Then, the connection hole 62 and the connection through-hole 61 are formed. The connection trough-hole 61 reaches to the uppermost layer of the wiring 53 on the side of the second semiconductor substrate 45. Next, a through-connection conductor 64 and a connection conductor 65 are embedded in the connection through-hole 61 and the connection hole 62, respectively. After that, an insulating protective layer 66 is formed on the entire surface on the back side 31b of the first semiconductor substrate 31. The manufacturing steps illustrated in FIG. 20 are the same as those illustrated in FIGS. 9 to 11. The same reference numerals as in FIGS. 9 to 11 are used to denote the corresponding structural components. Thus, redundant descriptions will be omitted.

Figure 21:
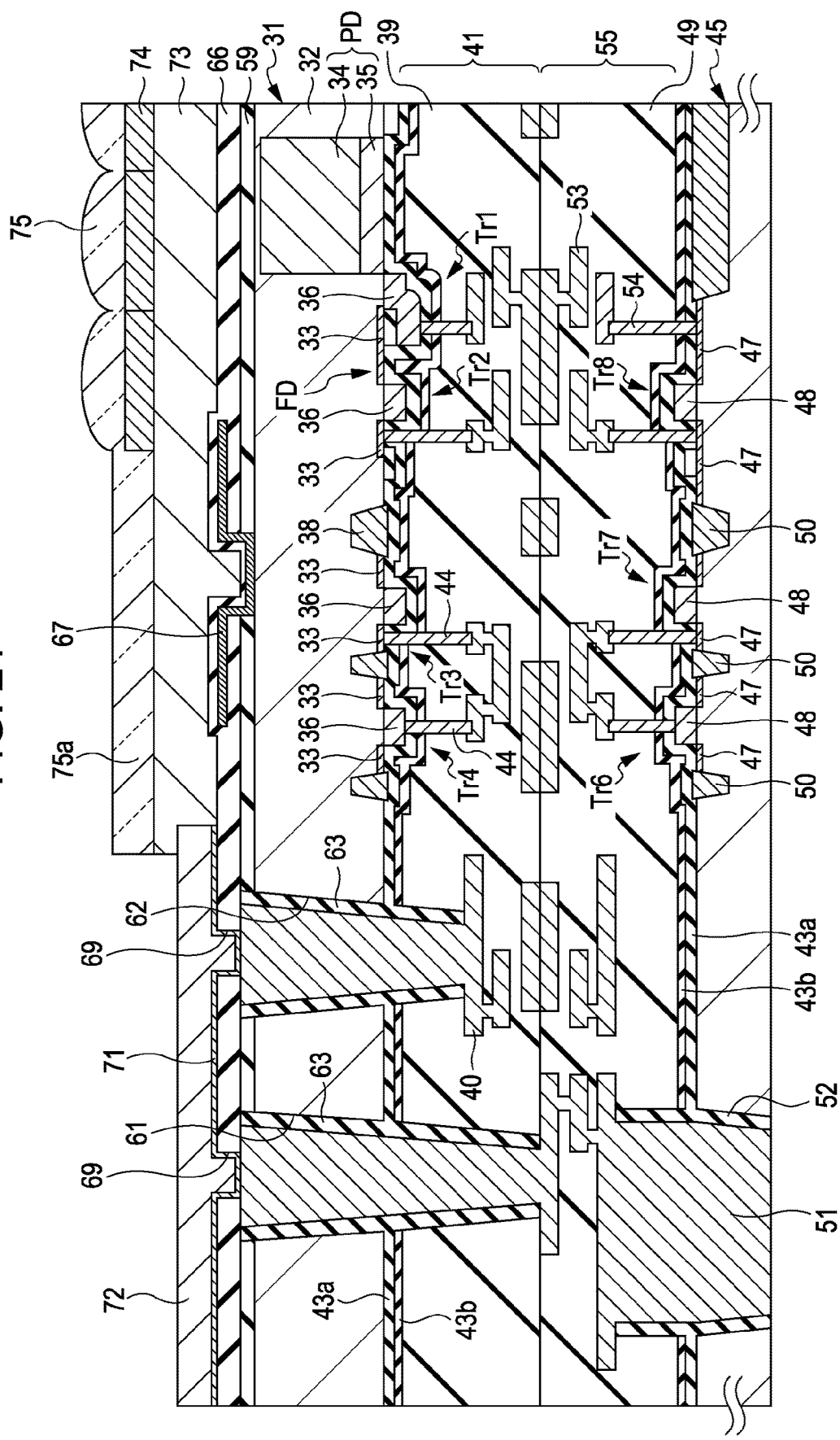
FIG. 21 is a diagram (fifth) illustrating the example of the method of manufacturing the solid-state imaging device according to the fourth embodiment of the present invention.

Next, as shown in FIG. 21, an electronic pad 72 and a light-shielding layer 67 are formed on the side of the first semiconductor substrate 31. Here, the electric pad 72 is connected to the connection conductor 62 and the through-connection conductor 61. Furthermore, a planarizing layer 73, an on-chip color filter 74, and an on-chip microlens 74 are formed on the same side. On the other hand, on the side of the second semiconductor substrate 45, the back side of the substrate is ground and polished to expose the connection conductor 51. A passivation layer 76 is formed and an electrode bump 78 is then formed on the connection conductor (see FIG. 16). The manufacturing steps illustrated in FIG. 21 are the same as those illustrated in FIG. 13 as described above. The same reference numerals as in FIG. 13 are used to denote the corresponding structural components. Thus, redundant descriptions will be omitted.

Figure 16:
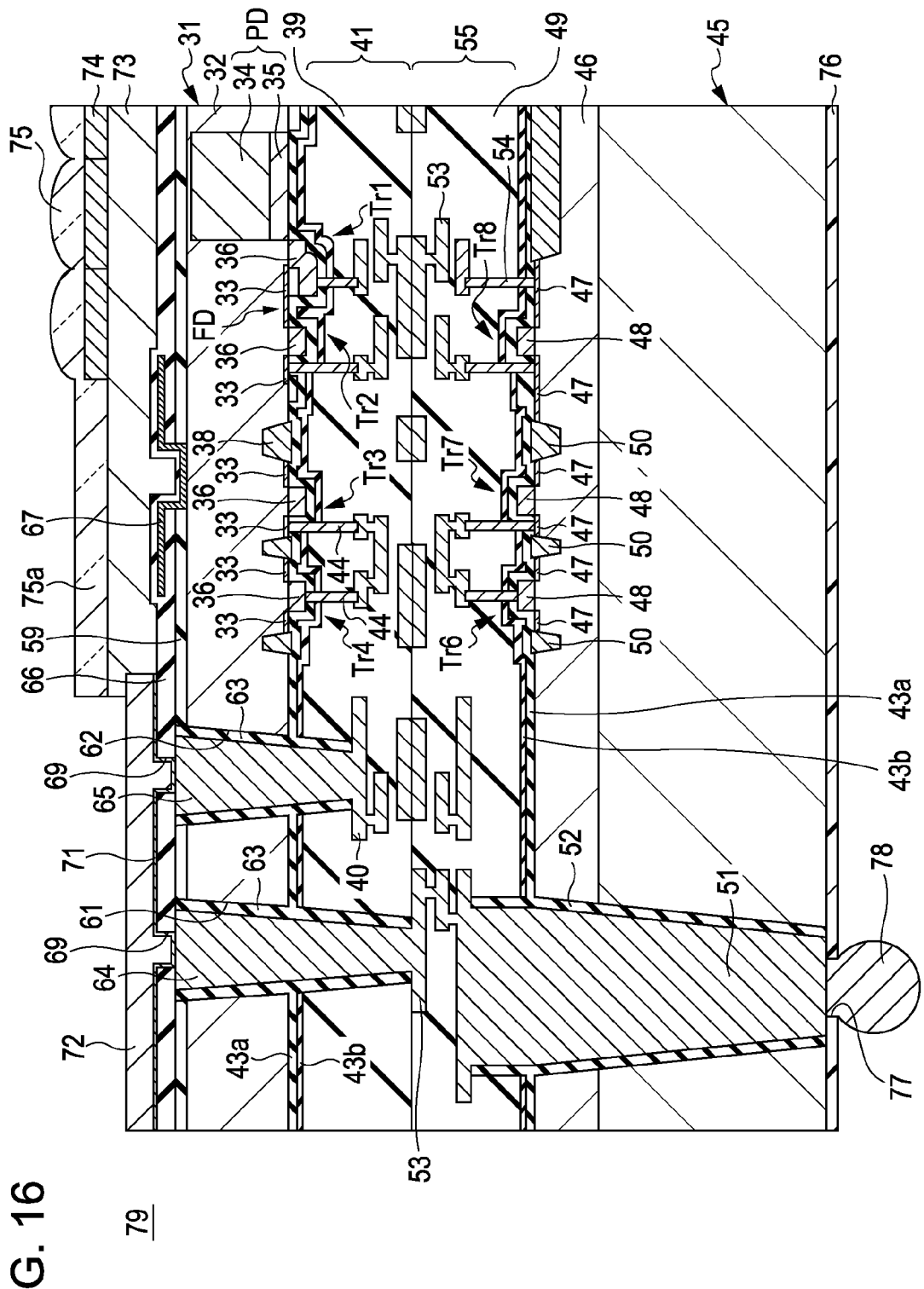
FIG. 16 is a schematic diagram illustrating a main part of a solid-state imaging device according to a fourth embodiment of the present invention.

Subsequently, the resulting product is divided into the respective microchips, thereby obtaining a desired back-illuminated solid-state imaging device 91 as shown in FIG. 16. In this embodiment, the configuration of the device illustrated in FIG. 2B is employed. Alternatively, the configuration of the device illustrated in FIG. 2C may be employed.

According to the solid-state imaging device 91 and the manufacturing method thereof according to the fourth embodiment of the present invention, in the step of combining the first semiconductor substrate 31 and the second semiconductor substrate 45, simultaneously, the wiring 40 and the wiring 53 are directly connected to each other. Thus, the pixel region 23 and the control circuit 24 are electrically connected to the logic circuit 25, completing their electrical connection. Therefore, the number of the manufacturing steps can be further reduced and a further reduction in manufacturing costs can be also attained. In addition, the device of the present embodiment exerts the same advantageous effects as those described in the first embodiment.

6. Fifth Embodiment

[Example of Configuration of Semiconductor Device and Example of Manufacturing Method Thereof]

Referring now to FIG. 22 and FIGS. 23 to 28, a semiconductor device and a manufacturing method thereof in accordance with the fifth embodiment of the present invention will be described. The semiconductor device of the present embodiment is a semiconductor device on which a first semiconductor integrated circuit and a second semiconductor integrated circuit are mounted in combination.

Figure 23:
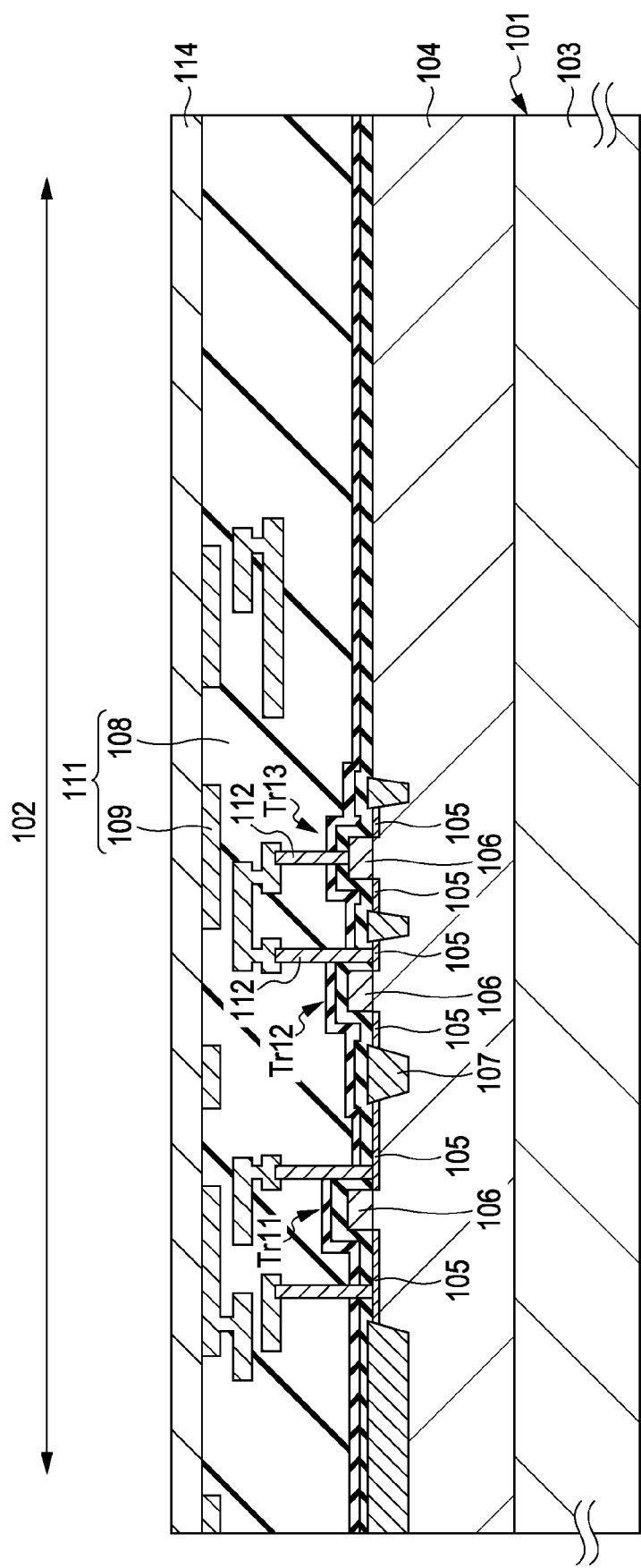
FIG. 23 is a diagram (first) illustrating the example of the method of manufacturing the semiconductor device according to the fifth embodiment of the present invention.

In the fifth embodiment, first, as shown in FIG. 23, a half-finished first semiconductor integrated circuit (logic circuit 102 in this example) is formed on a region to be provided as each of microchip parts on a first semiconductor substrate (semiconductor wafer) 101. In other words, on the region to be provided as each of microchip parts on the semiconductor well region 104 formed in the semiconductor substrate (e.g., silicon substrate) 103, a plurality of MOS transistors Tr11, Tr12, and Tr13 are formed. Each of the MOS transistors Tr11 to Tr13 includes a pair of source/drain regions 105 and a gate electrode 106 with a gate insulating layer placed therebetween. The MOS transistors Tr11 to Tr13 are separated from one another by the presence of isolation regions 107, respectively. Here, but not limited to, the MOS transistors are represented by MOS transistors Tr11 to Tr13. The logic circuit 102 includes CMOS transistors. Therefore, these MOS transistors may be n-channel MOS transistors or p-channel MOS transistors. Thus, when the n-channel MOS transistor is formed, an n-type source/drain region is formed on a p-type semiconductor well region. When a p-channel MOS transistor is formed, a p-type source/drain region is formed in an n-type semiconductor well region.

Furthermore, for example, the first semiconductor integrated circuit may be a semiconductor memory circuit instead of the logic circuit 102. In this case, the logic circuit to be used as a second semiconductor integrated circuit is subjected to the signal processing of the semiconductor memory circuit.

Next, a plurality of layers are formed on the conductive substrate 103 through an interlayer insulating layer 108. In this example, a multi-wiring layer 111 is formed by laminated three metal wiring layers 109. For example, the metal wiring 109 may be made of copper, or Cu wiring. In addition, the respective MOS transistors Tr11 to Tr13 are connected to one another through the desired first layer of the wiring 109 and a connection conductor 112. Furthermore, three layers of the wiring 109 are connected to one another through the connection conductor. A cap layer, a so-called protective layer 114 which prevents the copper wiring 109 from being dispersed, is formed on the multi-wiring layer 113.

Figure 24:
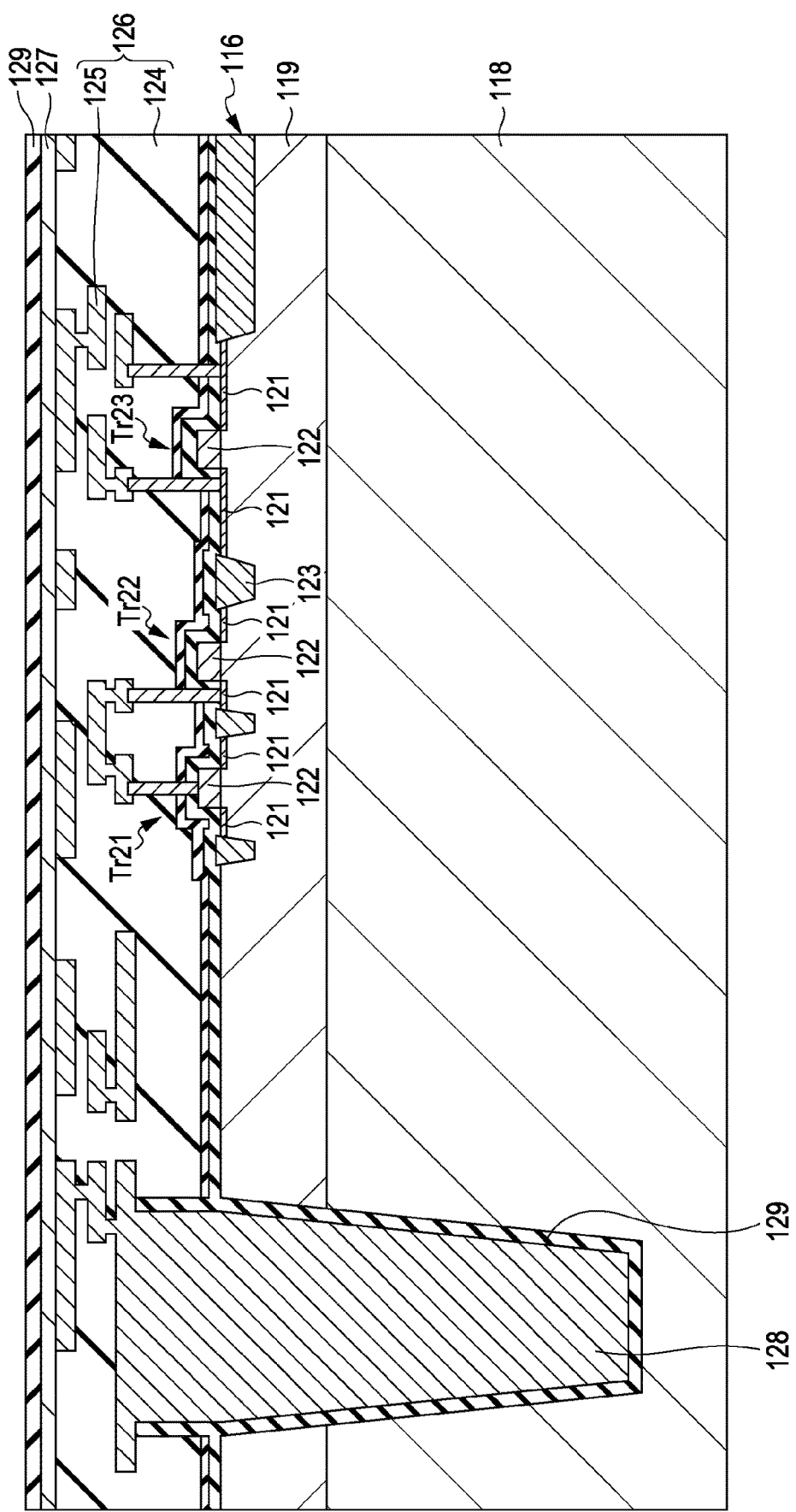
FIG. 24 is a diagram (second) illustrating the example of the method of manufacturing the semiconductor device according to the fifth embodiment of the present invention.

On the other hand, as shown in FIG. 24, a half-finished second semiconductor integrated circuit, a logic circuit 117 is formed in a region to be provided as each microchip part of the second semiconductor substrate (semiconductor wafer) 116. In other words, as shown in FIG. 20, on the region to be provided as each of microchip parts on the semiconductor well region 119 formed in the semiconductor substrate (e.g., silicon substrate) 118, a plurality of n-channel MOS transistors Tr21, Tr22, and Tr23 are formed. Each of the MOS transistors Tr21 to Tr23 includes a pair of source/drain regions 121 and a gate electrode 122 with a gate insulating layer placed therebetween. The MOS transistors Tr21 to Tr23 are separated from one another by the presence of isolation regions 123, respectively. Here, but not limited to, the MOS transistors are represented by MOS transistors Tr21 to Tr23. The logic circuit 117 includes CMOS transistors. Therefore, these MOS transistors may be n-channel MOS transistors or p-channel MOS transistors. Thus, when the n-channel MOS transistor is formed, an n-type source/drain region is formed on a p-type semiconductor well region. When a p-channel MOS transistor is formed, a p-type source/drain region is formed in an n-type semiconductor well region.

Next, a plurality of layers is formed on the conductive substrate 118 through an interlayer insulating layer 124. In this example, a multi-wiring layer 126 is formed by laminated three metal wiring layers 125. For example, the metal wiring 125 may be made of copper, or Cu wiring. In addition, the respective MOS transistors Tr21 to Tr23 are connected to one another through the desired first layer of the wiring 125 and a connection conductor 112. Furthermore, three layers of the wiring 125 are connected to one another through the connection conductor.

On the semiconductor substrate 118, furthermore, at a desired position on the area to be provided as each of microchip parts, a connection hole is formed from the surface of the first insulating interlayer 124 to a predetermined depth position in the semiconductor substrate 118. Then, a connection conductor 128 for extraction electrode is embedded in the resulting connection hole. The connection conductor 128 may be made of copper (Cu), tungsten (W), polysilicon, or the like. Before embedding the connection conductor 128, an insulation layer 129 is formed on the inner wall surface of the connection hole to insulate the connection conductor 128 from the semiconductor substrate 118. Then, a cap layer, a so-called protective layer 127 which prevent the copper wiring 125 from being dispersed, is formed on the multi-wiring layer 126.

Figure 25:
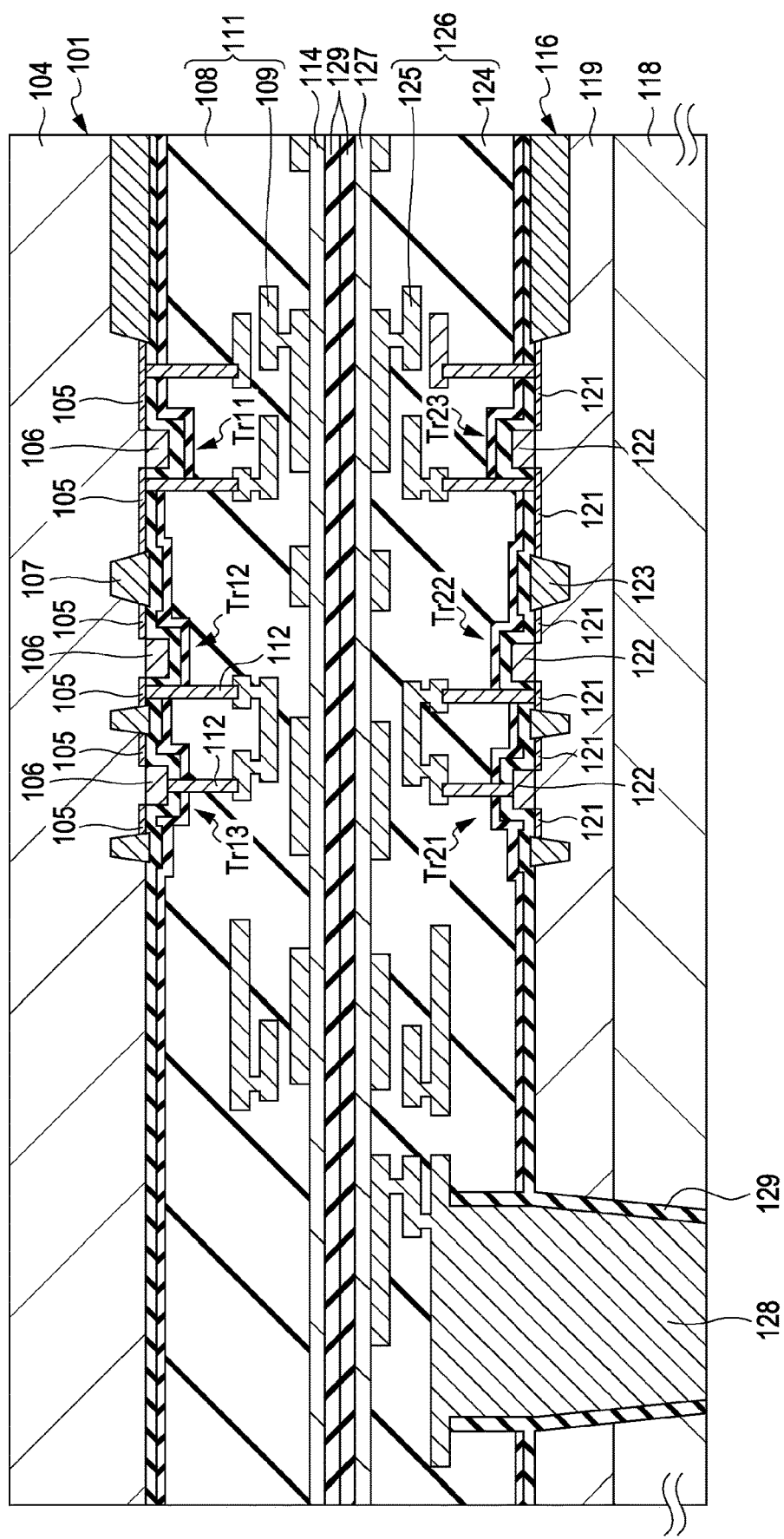
FIG. 25 is a diagram (third) illustrating the example of the method of manufacturing the semiconductor device according to the fifth embodiment of the present invention.

Next, as shown in FIG. 25, the first semiconductor substrate 101 and the second semiconductor substrate 116 are bonded together so that their respective multi-wiring layers 111 and 126 can be faced with each other. Just as in the case with the aforementioned embodiment, the bonding may be performed using plasma bonding, an adhesive agent, or the like. In this example, on the bonding surface of each of the first and second semiconductor wafers 101 and 116, a layer 129, such as a plasma TEOS film, a plasma SiN film, a SiON film (block film), or a SiC film, is formed and bonded together by plasma bonding.

Figure 26:
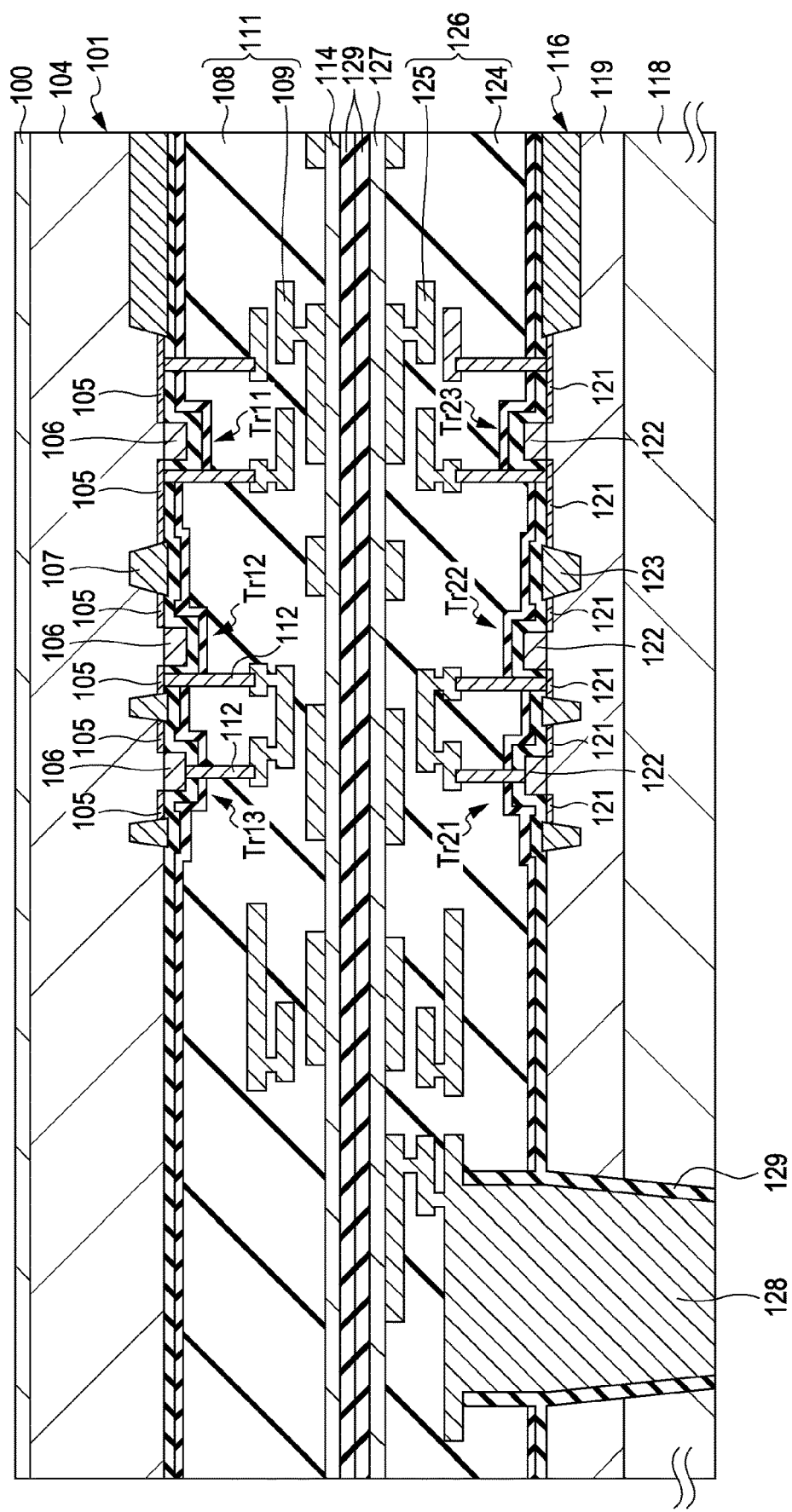
FIG. 26 is a diagram (fourth) illustrating the example of the method of manufacturing the semiconductor device according to the fifth embodiment of the present invention.

Next, as shown in FIG. 26, grinding and polishing are performed from the back side of the first semiconductor substrate 101 to thin the first semiconductor substrate 101. For example, the semiconductor substrate 101 with a thickness of 600 μm may be thinned to about 5 to 10 μm.

Figure 27:
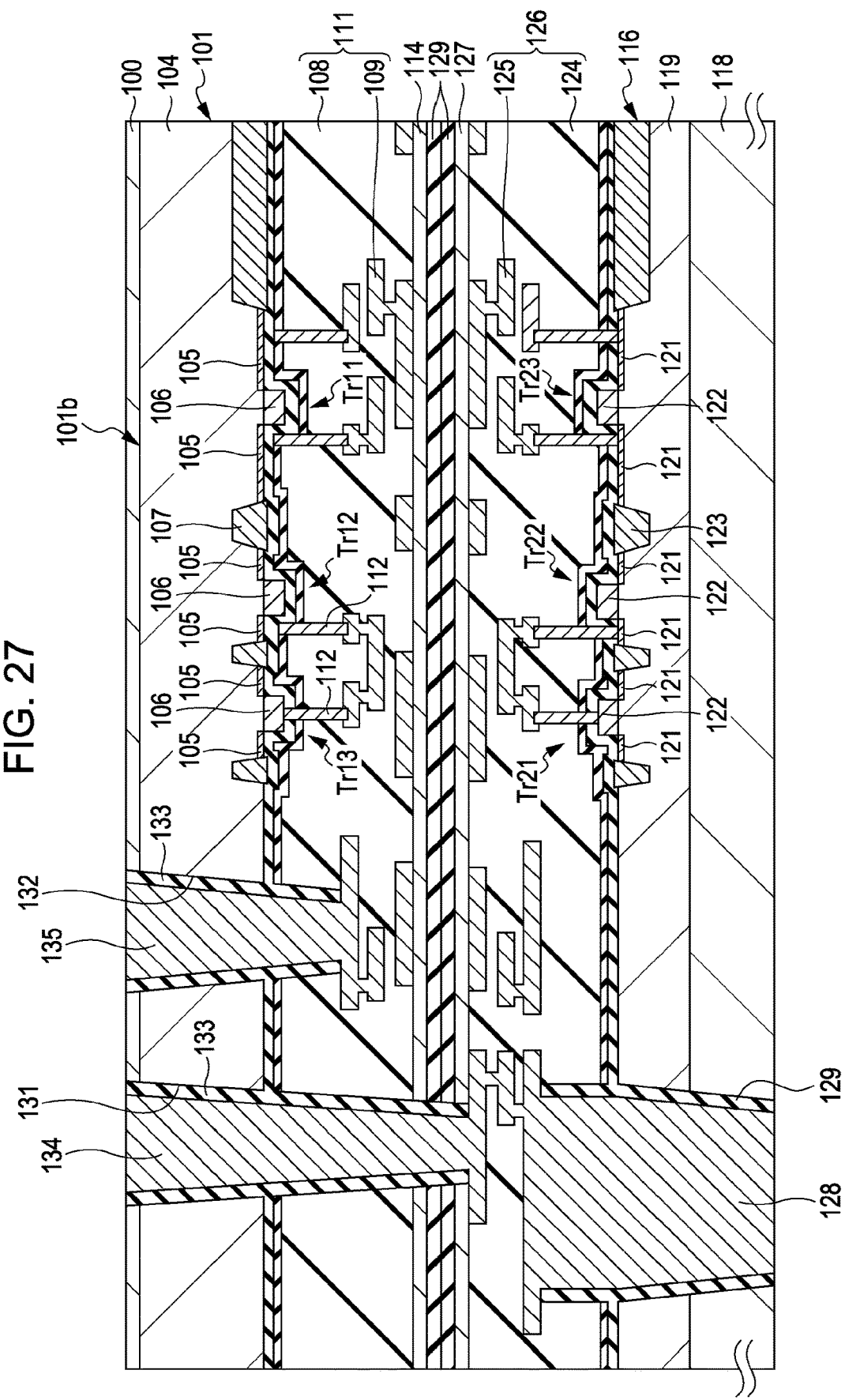
FIG. 27 is a diagram (fifth) illustrating the example of the method of manufacturing the semiconductor device according to the fifth embodiment of the present invention.

Next, as shown in FIG. 27, a connection through-hole 131 is formed in the thin-filmed first semiconductor substrate 101 at a desired position of a region to be provided as each microchip part. The connection through-hole 131 extends from the back side 101b to the uppermost layer of the wiring 125 of the second semiconductor substrate 116 through the first semiconductor substrate 101. Simultaneously, a connection hole 132 is formed near the connection through-hole 131 in the first semiconductor substrate 101, extending from the back side 101b to a first layer portion of wiring 109 on the first semiconductor substrate 101. Since the connection through-hole 131 and the connection hole 132 are formed after making the first semiconductor substrate 101 into a thin film, these holes 131 and 132 can be formed as micropores with a smaller aspect ratio. Subsequently, an insulating layer 133 for electric insulation with the semiconductor substrate 101 is formed on the inner wall surface of each of the connection through-hole 131 and the connection hole 132.

Next, a through-connection conductor 134 and a connection conductor 135 are embedded in the connection through-hole 131 and the connection hole 132, respectively. Each of the through-connection conductor 134 and the connection conductor 135 may be made of a metal, such as copper (Cu) or tungsten (W).

Figure 28:
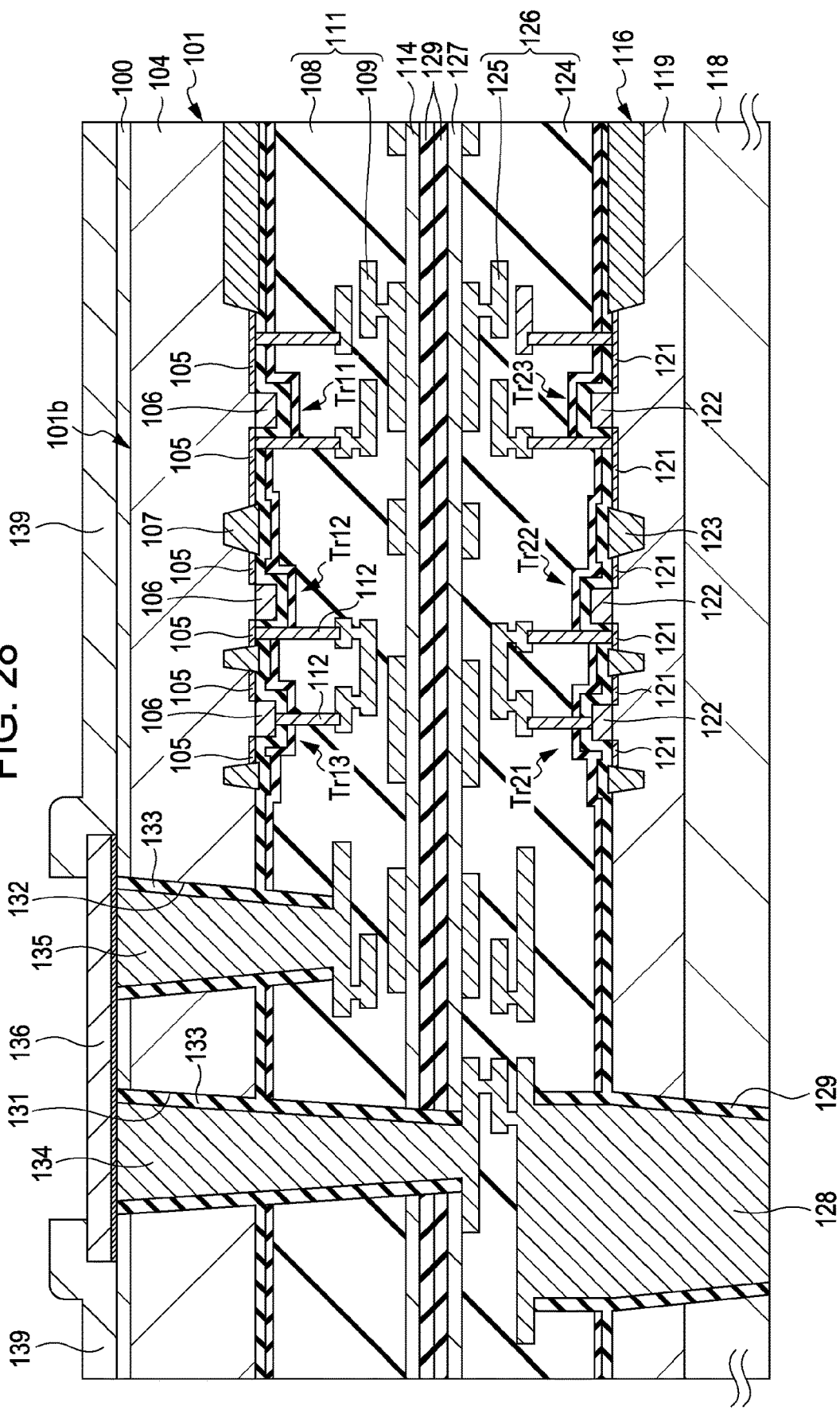
FIG. 28 is a diagram (sixth) illustrating the example of the method of manufacturing the semiconductor device according to the fifth embodiment of the present invention.

Next, as shown in FIG. 28, connection wiring 136 is formed on the back side of the first semiconductor substrate 101 to make a connection between the through-connection conductor 134 and the connection conductor 135. The first semiconductor integrated circuit 102 is electrically connected to the second semiconductor integrated circuit 117 through the connection conductor 135, the through-connection conductor 134, and the connection wiring 136. The connection wiring 136 serves as an electrode pad used as an extraction electrode. An insulating layer is applied to the surface except for the connection wiring 136 to form an overcoat layer 139. The overcoat layer 139 may be, for example, a plasma silicon nitride film. On the other hand, on the side of the second semiconductor substrate 116, the surface of the substrate 116 is ground to expose the surface of the connection conductor 128 that serves as an extraction electrode. After forming a passivation layer 137 on the exposed surface of the connection conductor 128 of the second semiconductor substrate 116, a spherical electrode bump 138 is formed so that it can be electrically connected to the connection conductor 128 (see FIG. 22).

Figure 22:
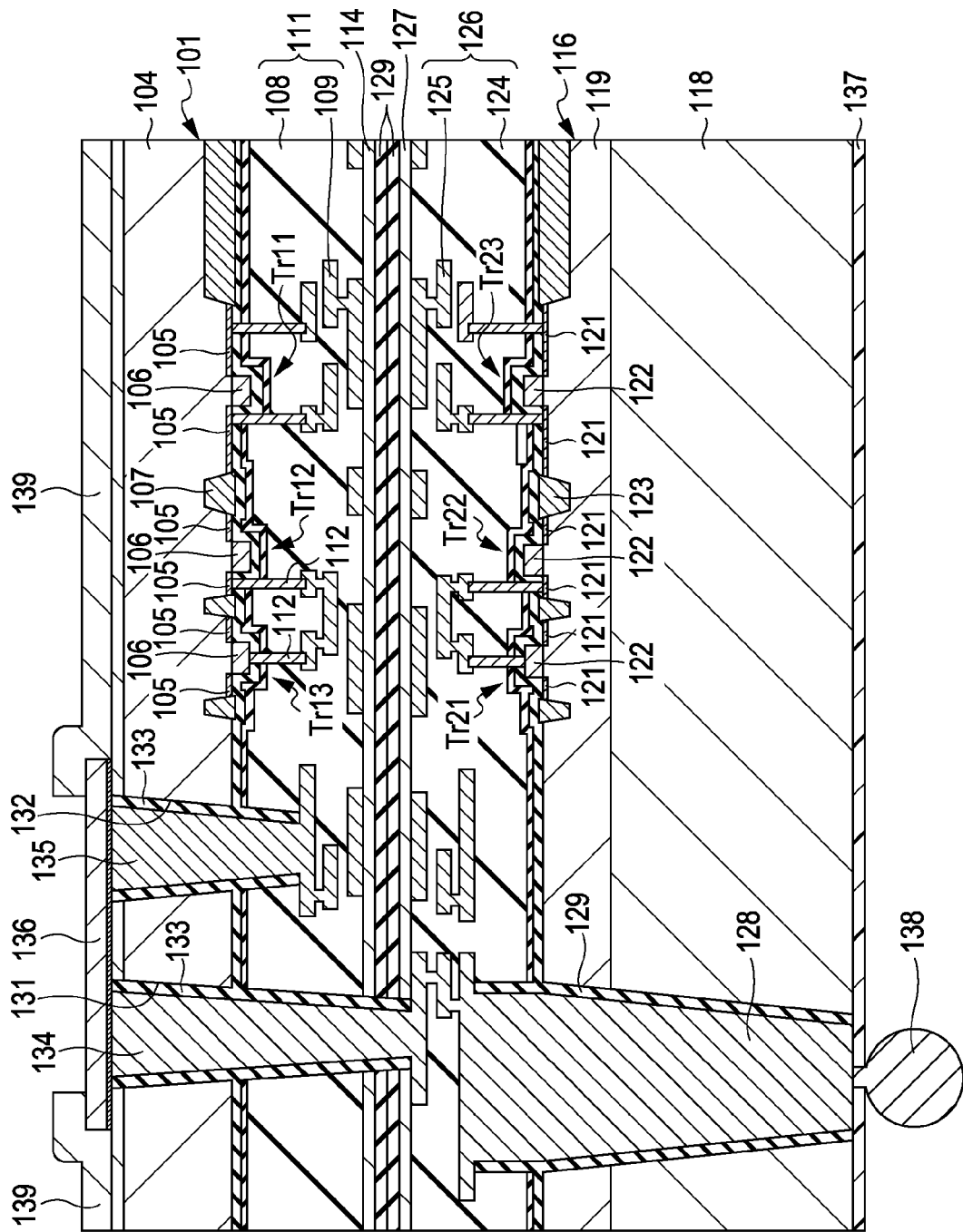
FIG. 22 is a schematic diagram illustrating a main part of a semiconductor device according to a fifth embodiment of the present invention.

Subsequently, the resultant is divided into each chip and semiconductor device 140 to be shown in FIG. 22 is obtained.

According to the semiconductor device 140 and the manufacturing method thereof according to the fifth embodiment of the present invention, just as in the case with the aforementioned embodiments, the first semiconductor integrated circuit and the second semiconductor integrated circuit can be independently formed on different microchip parts by their optimal process technologies, respectively. Therefore, a high-performance semiconductor integrated circuit can be provided. In addition, a reduction in manufacturing costs can be attained by bonding and thinning the first and second semiconductor wafers together in a half-finished product state, electrically connecting the first and second integrated circuits to each other, and dividing the resulting combination in a completed product state into microchips.

In the fifth embodiment, just as in the case with the fourth embodiment, the first and second semiconductor substrates may be bonded together to directly connect the wiring layers of multi-layered wiring to each other. Such a configuration of the device can lead to a decrease in number of manufacturing steps and a further reduction in manufacturing costs.

Although the solid-state imaging device according to any of the above embodiments uses electrons as signal electric charges, a p-type as a first-conductivity type, and an n-type as a second-conductivity type, it may be also applied to one using electron holes as signal electronic charges. In this case, the conductivity types of the semiconductor substrates, semiconductor well regions, or semiconductor regions are reversed. Thus, the n-type is provided as the first-conductivity type and the p-type is provided as the second-conductivity type.

In the solid-state imaging device according to any of the above embodiments, the first semiconductor chip section 22 may have a thickness smaller than the thickness of the second semiconductor chip section 26.

7. Sixth Embodiment

[Example of Configuration of Electronic Apparatus]

The solid-state imaging devices according to the embodiments of the present invention can be applied to electronic apparatuses including camera systems such as digital cameras and video cameras, cellular phones with imaging functions, other apparatuses with imaging functions, and so on.

Figure 29:
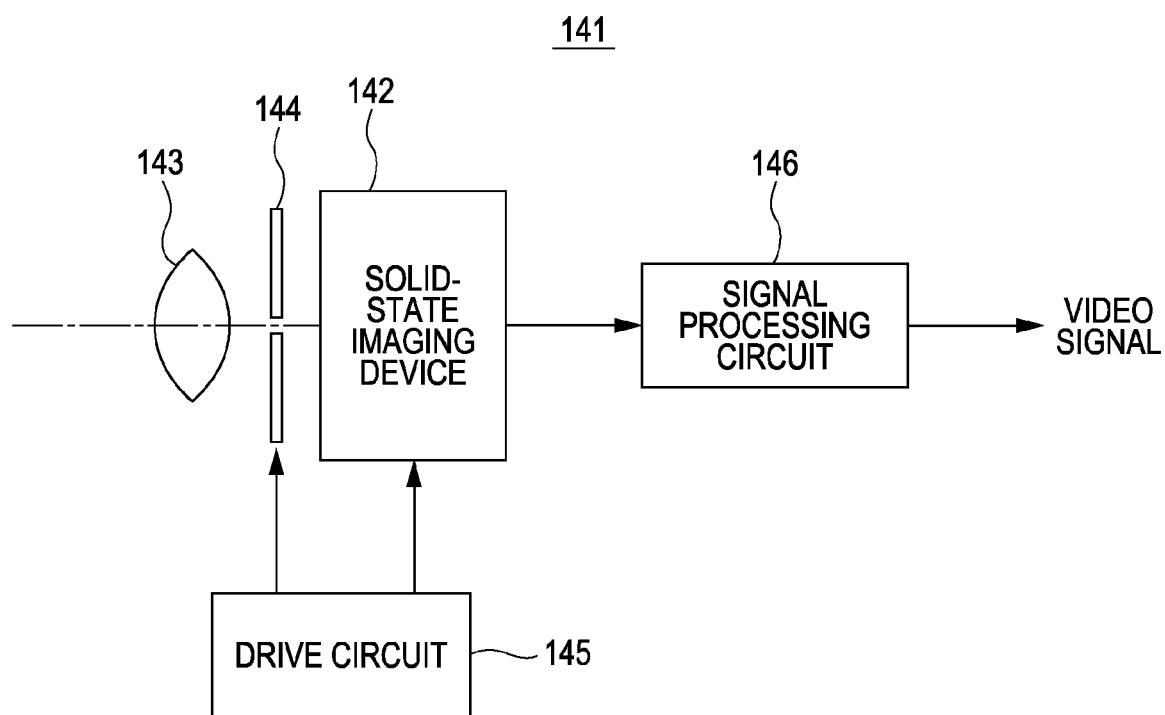
FIG. 29 is a schematic diagram illustrating the configuration of an electronic apparatus according to a sixth embodiment of the present invention.

FIG. 29 illustrates the configuration of a camera as an exemplary electronic apparatus according to the sixth embodiment of the present invention. An example of the camera according to the present embodiment is a video camera which can shoot a still picture or video. The camera 141 of the present embodiment includes a solid-state imaging device 142, an optical system 143 that introduces incident light into a photoreceptor of the solid-state imaging device 142, and a shutter device 144. Furthermore, the camera 141 includes a drive circuit 145 for driving the solid-state imaging device 142 and a signal processing circuit 146 for processing an output signal from the solid-state imaging device 142.

The solid-state imaging device 142 is any of the solid-state imaging devices of the aforementioned embodiments. The optical system (optical lens) 143 carries out image formation of image light (incident light) from a photographic subject onto an imaging surface of the solid-state imaging device 142. Therefore, signal electric charges are accumulated in the solid-state imaging device 142 for a given period of time. The optical system 143 may be an optical lens system constructed of a plurality of optical lenses. The shutter device 144 controls a period of light irradiation on the solid-state imaging device 142 and a period of light shielding. The drive circuit 145 supplies drive signals for controlling the transfer operation of the solid-state imaging device 142 and the shutter operation of the shutter device 144. The driving signals (timing signals) supplied from the drive circuit 145 allow the solid-state imaging device 142 to transmit signals. The signal-processing circuit 146 performs various kinds of signal processing. Video signals subjected to the signal processing are stored in a storage medium such as a memory or outputted to a monitor.

The electronic apparatus, such as a camera, according to the sixth embodiment of the present invention includes a high-performance solid-state imaging device 142 with a lower production cost. Therefore, an inexpensive and reliable electronic apparatus can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A light detecting device, comprising:
a first semiconductor section including a first multi-wiring layer and a photodiode, wherein the first multi-wiring layer is on a side of the first semiconductor section opposite to a light incident side of the first semiconductor section, and wherein the first multi-wiring layer includes a first plurality of wiring layers and a first insulating interlayer; and
a second semiconductor section including a second multi-wiring layer and a signal processing circuit, wherein the second multi-wiring layer includes a second plurality of wiring layers and a second insulating interlayer,
wherein the first semiconductor section and the second semiconductor section are bonded together such that the first multi-wiring layer and the second multi-wiring layer face one another, wherein a first wiring included in the first plurality of wiring layers and a second wiring included in the second plurality of wiring layers are connected to each other, wherein a first part of the first insulating interlayer and a first part of the second insulating interlayer are connected to each other, wherein the first wiring is electrically connected to the photodiode, wherein the second wiring is electrically connected to the signal processing circuit, wherein the first wiring and the second wiring are disposed in a peripheral region other than a pixel region including the photodiode, and wherein the first plurality of wiring layers includes a third wiring and a fourth wiring, the third wiring and the fourth wiring are disposed in different layers, and a second part of the first insulating interlayer is disposed between the third wiring and the fourth wiring.

2. The light detecting device according to claim 1, wherein the second plurality of wiring layers includes a fifth wiring and a sixth wiring, the fifth wiring and the sixth wiring are disposed in different layers, and a second part of the second insulating interlayer is disposed between the fifth wiring and the sixth wiring.

3. The light detecting device according to claim 2, wherein the first multi-wiring layer includes a connection conductor, and wherein the photodiode and the third wiring are electrically connected via the connection conductor.

4. The light detecting device according to claim 3, wherein a third part of the first insulating interlayer is disposed between the third wiring and the first wiring in a direction perpendicular to the light incident side of the first semiconductor section.

5. The light detecting device according to claim 4, wherein the first and second insulating interlayers are connected to each other along a common plane, and wherein the first and second wirings are connected to each other along the common plane.

6. The light detecting device according to claim 1, wherein the photodiode generates a signal based on an amount of incident light, and the signal is transferred from the photodiode to a part of the signal processing circuit via the first wiring and the second wiring.

7. A light detecting device, comprising:
a first semiconductor section including a first multi-wiring layer and a photodiode, wherein the first multi-wiring layer is on a side of the first semiconductor section opposite to a light incident side of the first semiconductor section, and wherein the first multi-wiring layer includes a first plurality of wiring layers and a first insulating interlayer; and
a second semiconductor section including a second multi-wiring layer and a signal processing circuit, wherein the second multi-wiring layer includes a second plurality of wiring layers and a second insulating interlayer,
wherein the first semiconductor section and the second semiconductor section are bonded together such that the first multi-wiring layer and the second multi-wiring layer face one another,
wherein a first wiring included in the first plurality of wiring layers and a second wiring included in the second plurality of wiring layers are connected to each other,
wherein a first part of the first insulating interlayer and a first part of the second insulating interlayer are connected to each other,
wherein the first wiring is electrically connected to the photodiode,
wherein the second wiring is electrically connected to the signal processing circuit, and
wherein the first plurality of wiring layers includes a third wiring, the first wiring and the third wiring are disposed in different layers, and a second part of the first insulating interlayer is disposed between the first wiring and the third wiring.

8. The light detecting device according to claim 7, wherein the second plurality of wiring layers includes a fourth wiring, the second wiring and the fourth wiring are disposed in different layers, and a second part of the second insulating interlayer is disposed between the second wiring and the fourth wiring.

9. The light detecting device according to claim 8, wherein the first multi-wiring layer includes a connection conductor, and wherein the photodiode and the third wiring are electrically connected via the connection conductor.

10. The light detecting device according to claim 9, wherein the second part of the first insulating interlayer is disposed between the third wiring and the first wiring in a direction perpendicular to the light incident side of the first semiconductor section.

11. The light detecting device according to claim 10, wherein the first and second insulating interlayers are connected to each other along a common plane, and wherein the first and second wirings are connected to each other along the common plane.

12. The light detecting device according to claim 11, wherein the third wiring is connected to a floating diffusion.

13. The light detecting device according to claim 12, wherein the first plurality of wiring layers includes a fifth wiring, and the fifth wiring is connected to the floating diffusion and an amplification transistor.

14. The light detecting device according to claim 11, wherein the third wiring is connected to an amplification transistor.

15. The light detecting device according to claim 9, wherein the signal is transferred from the photodiode to a part of the signal processing circuit via the third wiring and the connection conductor.

16. The light detecting device according to claim 9, further comprising, a floating diffusion and a transfer transistor disposed in the first semiconductor section.

17. The light detecting device according to claim 16, further comprising, at least one of a reset transistor, an amplification transistor and a select transistor disposed in the first semiconductor section.

18. The light detecting device according to claim 7, wherein the first wiring and the second wiring includes copper (Cu).

19. The light detecting device according to claim 7, wherein the photodiode generates a signal based on an amount of incident light, and the signal is transferred from the photodiode to a part of the signal processing circuit via the first wiring and the second wiring.

20. The light detecting device according to claim 7, wherein the first wiring and the second wiring are disposed in a pixel region including the photodiode.

21. The light detecting device according to claim 7, wherein the first plurality of wiring layers and the second plurality of wiring layers include copper (Cu).

22. The light detecting device according to claim 7, further comprising, an insulating layer is formed above the light incident side of the first semiconductor section.

23. The light detecting device according to claim 22, further comprising, at least one of an on-chip lens and a color filter formed above the insulating layer in a pixel region including the photodiode.

24. The light detecting device according to claim 7, wherein the signal processing circuit includes at least one of a column signal processing circuit and a logic circuit.

25. The light detecting device according to claim 24, wherein the column signal processing circuit performs at least one of noise removal, signal amplification and analogue-to-digital conversion.

26. The light detecting device according to claim 7, wherein the first wiring and the first part of the first insulating interlayer partially form a bonding surface of the first semiconductor section, and the second wiring and the first part of the second insulating interlayer partially form a bonding surface of the second semiconductor section, and the first semiconductor section and the second semiconductor section are bonded together such that the bonding surface of the first multi-wiring layer and the bonding surface of the second multi-wiring layer are bonded together.

27. The light detecting device according to claim 7, wherein the first wiring is covered by a first barrier metal layer and the second wiring is covered by a second barrier metal layer.

28. The light detecting device according to claim 27, wherein the first barrier metal layer and the second barrier metal layer include titanium (Ti).

* * * * *